United States Patent
Iguchi et al.

(10) Patent No.: US 12,146,057 B2
(45) Date of Patent: Nov. 19, 2024

(54) CYCLIC IMIDE RESIN COMPOSITION, PREPREG, COPPER-CLAD LAMINATE AND PRINTED-WIRING BOARD

(71) Applicant: Shin-Etsu Chemical Co., Ltd., Tokyo (JP)

(72) Inventors: Hiroyuki Iguchi, Annaka (JP); Masayuki Iwasaki, Annaka (JP); Naoyuki Kushihara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 260 days.

(21) Appl. No.: 17/549,260

(22) Filed: Dec. 13, 2021

(65) Prior Publication Data
US 2022/0195189 A1    Jun. 23, 2022

(30) Foreign Application Priority Data

Dec. 23, 2020  (JP) ................................. 2020-213136

(51) Int. Cl.
| | |
|---|---|
| C08L 79/08 | (2006.01) |
| C08G 73/10 | (2006.01) |
| C08J 5/24 | (2006.01) |
| C08K 5/5317 | (2006.01) |
| C08L 63/00 | (2006.01) |
| H05K 1/18 | (2006.01) |

(52) U.S. Cl.
CPC .......... *C08L 79/08* (2013.01); *C08G 73/1067* (2013.01); *C08G 73/1075* (2013.01); *C08J 5/24* (2013.01); *C08K 5/5317* (2013.01); *H05K 1/188* (2013.01); *C08L 63/00* (2013.01); *C08L 2201/08* (2013.01); *C08L 2203/20* (2013.01); *C08L 2205/025* (2013.01); *C08L 2205/03* (2013.01); *H05K 2201/0355* (2013.01)

(58) Field of Classification Search
CPC ...... C08L 79/08; C08L 63/00; C08L 2201/08; C08L 2203/20; C08L 2205/025; C08L 2205/03; C08G 73/1067; C08G 73/1075; C08J 5/24; C08K 5/5317; H05K 1/188; H05K 2201/0355
USPC ........................................................ 528/353
See application file for complete search history.

(56) References Cited

U.S. PATENT DOCUMENTS

| | | |
|---|---|---|
| 2018/0002485 A1 | 1/2018 | Tanigawa et al. |
| 2021/0206892 A1 | 7/2021 | Kumazawa et al. |

FOREIGN PATENT DOCUMENTS

| | | | |
|---|---|---|---|
| JP | 2018-28044 A | | 2/2018 |
| JP | 2018016793 A | * | 2/2018 |
| JP | 2018-44065 A | | 3/2018 |
| JP | 2018065903 A | * | 4/2018 |
| JP | 2019-1965 A | | 1/2019 |
| JP | 2020-46446 A | | 3/2020 |
| JP | 2021-187893 A | | 12/2021 |
| WO | WO 2016/114286 A1 | | 7/2016 |
| WO | WO 2018/051715 A1 | | 3/2018 |
| WO | WO 2020/045489 A1 | | 3/2020 |

OTHER PUBLICATIONS

Sato et al., JP 2018-065903 A machine translation in English, Apr. 26, 2018. (Year: 2018).*
Kuo, JP 2018-016793 A machine translation in English, Feb. 1, 2018. (Year: 2018).*
Japanese Office Action for Japanese Application No. 2020-213136, dated Aug. 29, 2023, with an English translation.

* cited by examiner

*Primary Examiner* — David T Karst
(74) *Attorney, Agent, or Firm* — Birch, Stewart, Kolasch & Birch, LLP

(57) ABSTRACT

Provided is a resin composition that has a low melt viscosity, and is capable of being turned into a cured product having a high heat resistance, a high adhesion and a high glass-transition temperature, though having a low permittivity and a low dielectric tangent. The resin composition is a cyclic imide resin composition containing:
(a) a cyclic imide compound represented by the following formula (1),

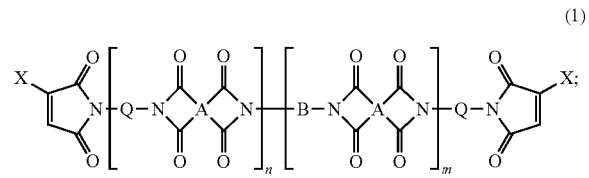

(b) a cyclic imide compound represented by the following formula (2),

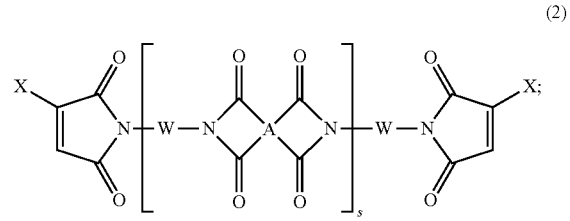

and
(c) a curing catalyst.

16 Claims, No Drawings

CYCLIC IMIDE RESIN COMPOSITION, PREPREG, COPPER-CLAD LAMINATE AND PRINTED-WIRING BOARD

BACKGROUND OF THE INVENTION

Field of the Invention

The present invention relates to a cyclic imide resin composition, a prepreg, a copper-clad laminate and a printed-wiring hoard.

Background Art

In recent years, as for mobile communication devices such as cellular phones, base station devices thereof, network infrastructure equipments such as servers and routers, and electronic devices such as large-scale computers, the speed and transmission capacity of the signals used therein are getting higher year by year. In this regard, since the printed-wiring boards installed in these electronic devices are subjected to uses in a high-frequency band such as a hand of 20 GHz, materials for printed-wiring boards are now required to possess even more favorable properties such as a low permittivity, a low dielectric tangent, a low thermal expansion rate, a high heat resistance and a low water absorbability.

Examples of a material possibly capable of fulfilling these properties include a modified polyphenylene ether resin, a maleimide resin and an epoxy resin (JP-A-2019-1965, JP-A-2018-28044 and JP-A-2018-44065). Particularly, a maleimide resin is employed as a material for a printed-wiring board for use in high-frequency bands, because the maleimide resin has a low permittivity and a low dielectric tangent, and also has a high heat resistance (WO 2016-114286 and JP-A-2020-45446).

However, a maleimide resin has, for example, a low adhesive force and a high melt viscosity; a maleimide resin does not sufficiently fulfill the properties of a material for a copper-clad laminate or a printed-wiring hoard. Further, as higher frequency hands are now used, it is desired that there be developed a maleimide resin having properties such as a high adhesiveness and a high glass-transition temperature.

SUMMARY OF THE INVENTION

Thus, the present invention is to provide a cyclic imide resin composition that has a low melt viscosity, and is capable of being turned into a cured product having a high heat resistance, a high adhesion and a high glass-transition temperature, though having a low permittivity and a low dielectric tangent.

The inventors of the present invention diligently conducted a series of studies to solve the aforementioned problems, and completed the invention as follows. That is, the inventors found that the following cyclic imide resin composition can achieve the above objective.

[1]
A cyclic imide resin composition comprising:
(a) a cyclic imide compound represented by the following formula (I), and having a weight-average molecular weight of 2,000 to 1,000,000,

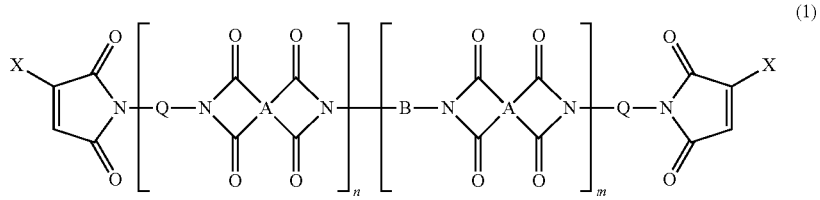

wherein A independently represents a cyclic structure-containing tetravalent organic group, B independently represents a divalent hydrocarbon group that may contain a hetero atom(s) and has 6 or more carbon atoms, Q independently represents an arylene group that may contain a hetero atom(s) and has 6 or more carbon atoms. X represents a hydrogen atom or a methyl group, n is I to 300, m is 0 to 300;
(b) a cyclic imide compound represented by the following formula (2), and having a. weight-average molecular weight of 200 to 2,000,

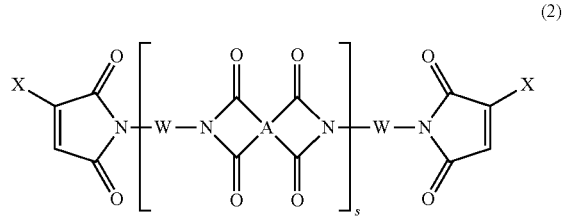

wherein A independently represents a cyclic structure-containing tetravalent organic group, X represents a hydrogen atom or a methyl group, W independently represents a divalent aliphatic hydrocarbon group that may contain a hetero atoms) and has 5 or more carbon atoms, s is 0 to 10; and
(c) a curing catalyst.

[2]
The cyclic imide resin composition according to [1], wherein the organic group represented by A in the formula (1) is any one of the tetravalent organic groups expressed by the following structural formulae:

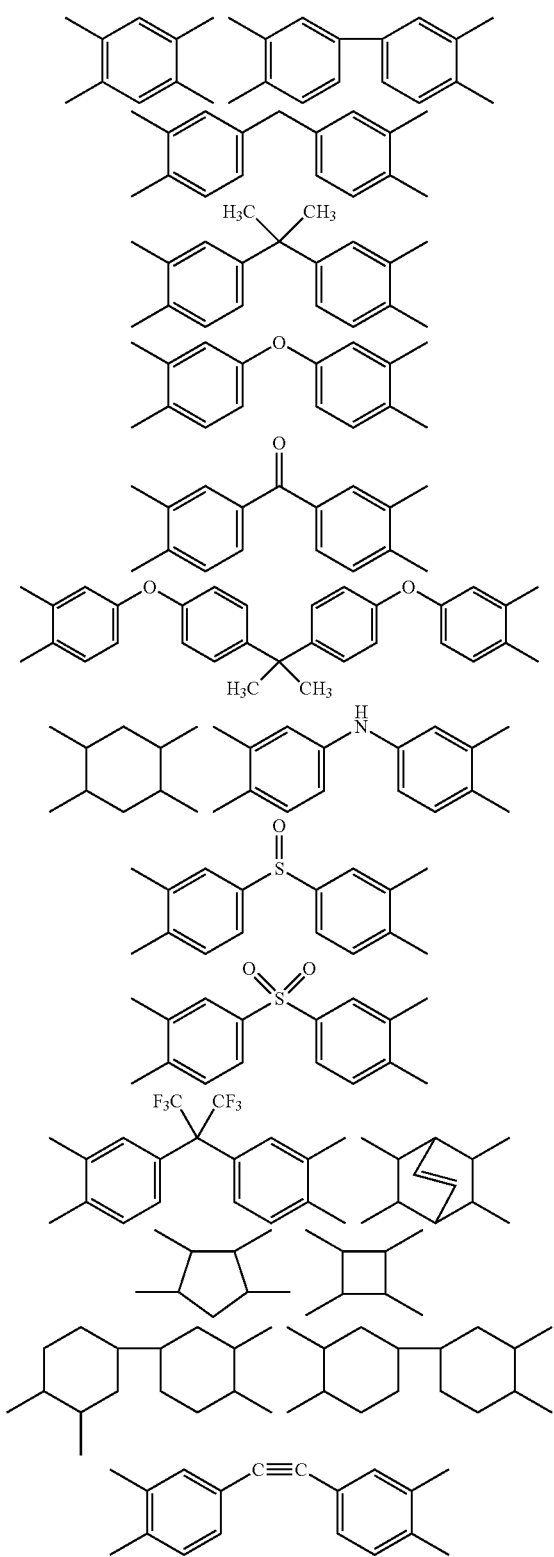

wherein bonds in the above structural formulae that are yet unbonded to substituent groups are to be bonded to carbonyl carbons forming cyclic imide structures in the formula (1).

[3]

The cyclic imide resin composition according to [1] or [2], wherein the divalent hydrocarbon group represented by B in the formula (1) is any one of the divalent hydrocarbon groups expressed by the following structural formulae:

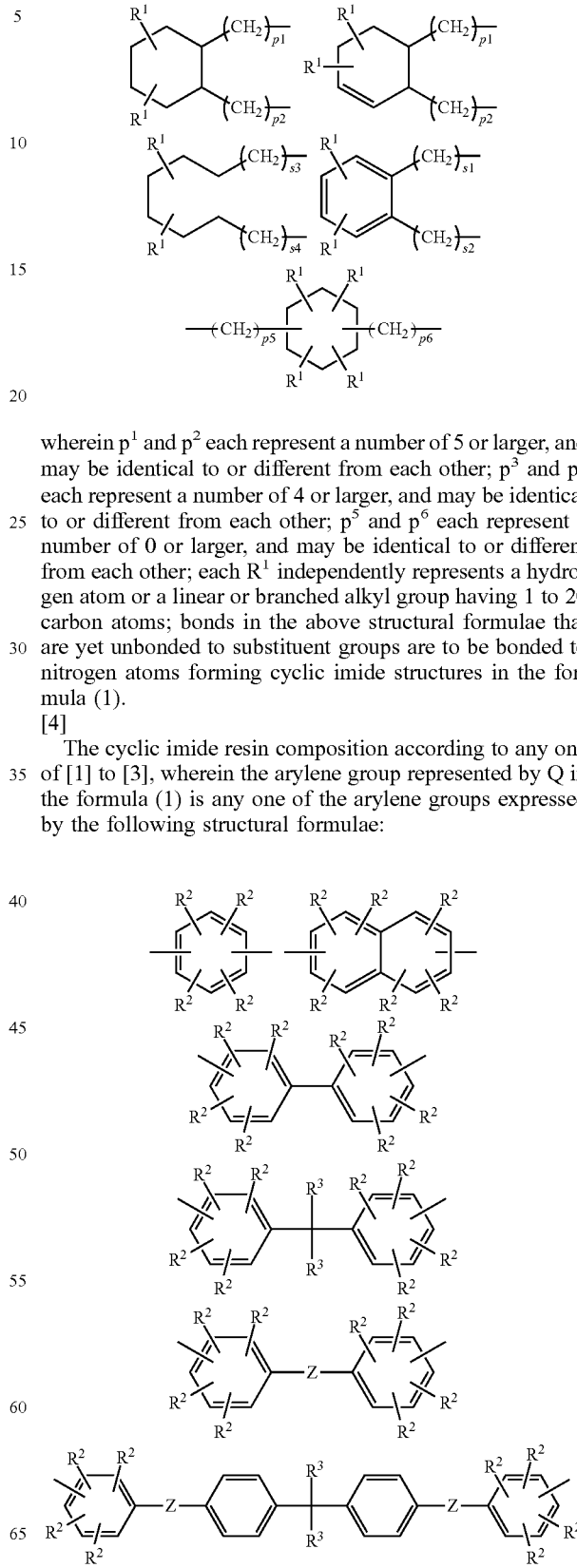

wherein $p^1$ and $p^2$ each represent a number of 5 or larger, and may be identical to or different from each other; $p^3$ and $p^4$ each represent a number of 4 or larger, and may be identical to or different from each other; $p^5$ and $p^6$ each represent a number of 0 or larger, and may be identical to or different from each other; each $R^1$ independently represents a hydrogen atom or a linear or branched alkyl group having 1 to 20 carbon atoms; bonds in the above structural formulae that are yet unbonded to substituent groups are to be bonded to nitrogen atoms forming cyclic imide structures in the formula (1).

[4]

The cyclic imide resin composition according to any one of [1] to [3], wherein the arylene group represented by Q in the formula (1) is any one of the arylene groups expressed by the following structural formulae:

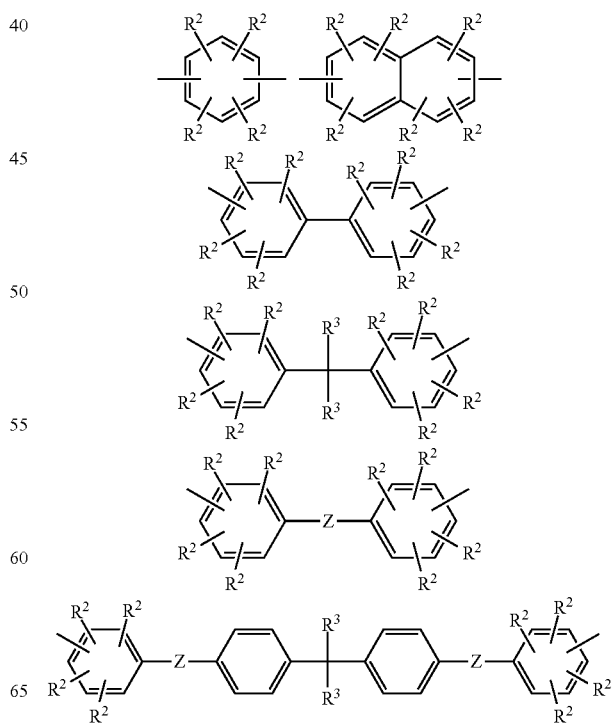

-continued

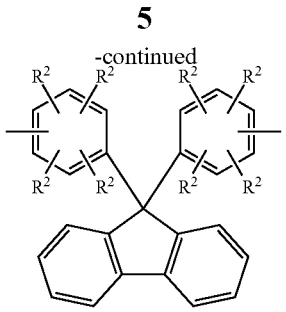

wherein each $R^2$ independently represents a hydrogen atom, a halogen atom or an alkyl group having 1 to 6 carbon atoms; each $R^3$ independently represents a hydrogen atom, a halogen atom, a methyl group or a trifluoromethyl group; Z represents an oxygen atom, a sulfur atom or a methylene group; bonds in the above structural formulae that are yet unbonded to substituent groups are to be bonded to nitrogen atoms forming cyclic imide structures in the formula (1).

[5]
The cyclic imide resin composition according to any one of [1] to [4], wherein in the formula (1), m=0.

[6]
The cyclic imide resin composition according to any one of [1] to [5], wherein the divalent aliphatic hydrocarbon group represented by W in the formula (2) is any one of the divalent aliphatic hydrocarbon groups expressed by the following structural formulae:

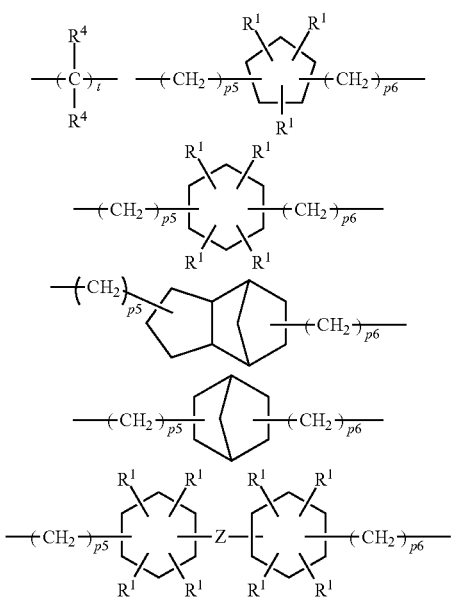

wherein $p^5$ and $p^6$ each represent a number of 0 or larger, and may be identical to or different from each other; each $R^1$ independently represents a hydrogen atom or a linear or branched alkyl group having 1 to 20 carbon atoms; Z represents an oxygen atom, a sulfur atom or a methylene group; $R^4$ represents a hydrogen atom, a halogen atom or an alkyl group having 1 to 6 carbon atoms; t is 5 to 12; bonds in the above structural formulae that are yet unbonded to substituent groups are to be bonded to nitrogen atoms forming cyclic imide structures in the formula (2).

[7]
The cyclic imide resin composition according to any one of [1] to [6], wherein in the formula (2), s=0.

[8]
The cyclic imide resin composition according to any one of [1] to [7], wherein the curing catalyst as the component (c) is at least one compound selected from an amine compound and an organic phosphorus compound.

[9]
The cyclic imide resin composition according to any one of [1] to [8], wherein the curing catalyst as the component (c) is a phosphonium salt comprised of a phosphonium cation and one molecule of an anion residue of a carboxylic acid.

[10]
The cyclic imide resin composition according to any one of [1] to [9], further comprising an epoxy resin as a component (d).

[11]
A prepreg comprising the cyclic imide resin composition according to any one of [1] to [10].

[12]
A copper-clad laminate comprising the prepreg according to [11].

[13]
A printed-wiring hoard comprising the copper-clad laminate according to [12].

The cyclic imide resin composition of the present invention has a low melt viscosity, and is capable of being turned into a cured product having a high heat resistance, a high adhesion and a high glass-transition temperature, though having a low permittivity and a low dielectric tangent. Thus, the cyclic imide resin composition of the present invention is suitable for use in, for example, a prepreg, a copper-clad laminate, a printed-wiring hoard, a base material film for a flexible printed-wiring board, a coverlay film, an adhesive agent for a coverlay film, an adhesive agent for heat dissipation, an electromagnetic wave shield and a semiconductor encapsulation material.

DETAILED DESCRIPTION OF THE INVENTION

The cyclic imide resin composition of the present invention is described in detail hereunder.

(a) Cyclic Imide Compound Represented by the Following Formula (1) and Having a Weight-Average Molecular Weight of 2,000 to 1,000,000

A cyclic imide compound as a component (a) is a main component of the cyclic imide resin composition of the present invention, and is represented by the following formula (1). By containing the component (a), the resin composition will be able to have a lower permittivity, a lower dielectric tangent and a higher strength.

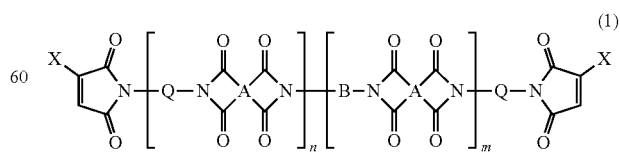

Here, an organic group represented by A in the formula (1) independently represents a cyclic structure-containing tetravalent organic group. It is particularly preferred that the organic group represented by A be any one of the tetravalent organic groups represented by the following structural formulae,

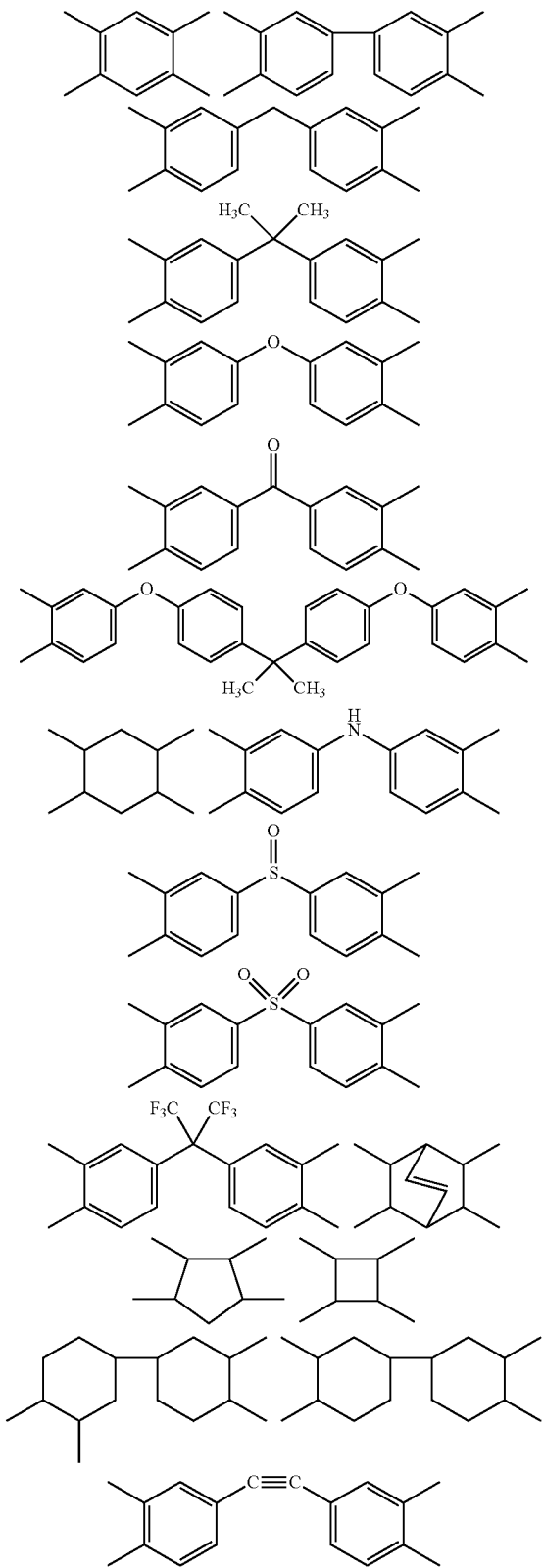

wherein bonds in the above structural formulae that are yet unbonded to substituent groups are to be bonded to carbonyl carbons forming cyclic imide structures in the formula (1).

Further, in the formula (1), B independently represents a divalent hydrocarbon group that may contain a hetero atom(s) and has 6 to 60 carbon atoms, preferably a divalent hydrocarbon group that may contain a hetero atom(s) and has 8 to 40 carbon atoms. More preferably, there are contained one or more kinds of the divalent hydrocarbon groups represented by any of the following structural formulae,

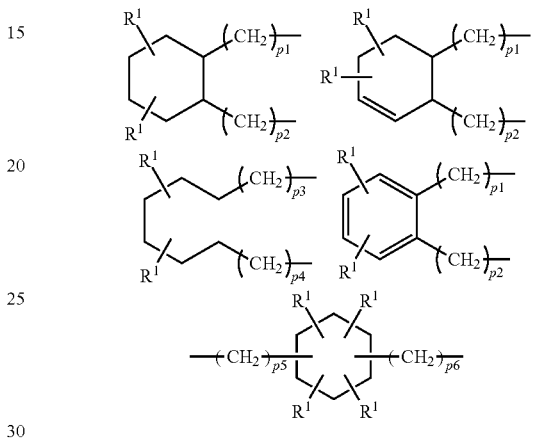

wherein bonds in the above structural formulae that are yet unbonded to substituent groups are to be bonded to nitrogen atoms forming cyclic imide structures in the formula (1).

In the above formulae, each of $p^1$ and $p^2$ represents a number of 5 to 12, preferably a number of 6 to 10; $p^1$ and $p^2$ may be identical to or different from each other.

Each of $p^3$ and $p^4$ represents a number of 2 to 10, preferably a number of 3 to 8; $p^3$ and $p^4$ may be identical to or different from each other.

Each of $p^5$ and $p^6$ represents a number of 0 to 4, preferably a number of to 2; $p^5$ and $p^6$ may be identical to or different from each other.

Each $R^1$ independently represents a hydrogen atom or a linear or branched alkyl group having 1 to 20 carbon atoms; preferably a hydrogen atom or a linear or branched alkyl group having 1 to 10 carbon atoms; more preferably a hydrogen atom or a linear alkyl group having 1 to 10 carbon atoms.

Further, in the formula (1), Q independently represents an arylene group that may contain a hetero atom(s) and has 6 to 30, preferably 6 to 18 carbon atoms. This arylene, group is a divalent group obtained by eliminating, from an aromatic hydrocarbon, two hydrogen atoms bonded to the carbon atoms composing an aromatic ring. Examples of such aromatic hydrocarbon include the following compounds.

Monocyclic or Polycyclic Aromatic Hydrocarbon

Compound in which two or more independent monocyclic or polycyclic aromatic hydrocarbons are bonded together via a single bond or a divalent organic group It is more preferred that Q in the formula (1) be an arylene group represented by any one of the following structural formulae.

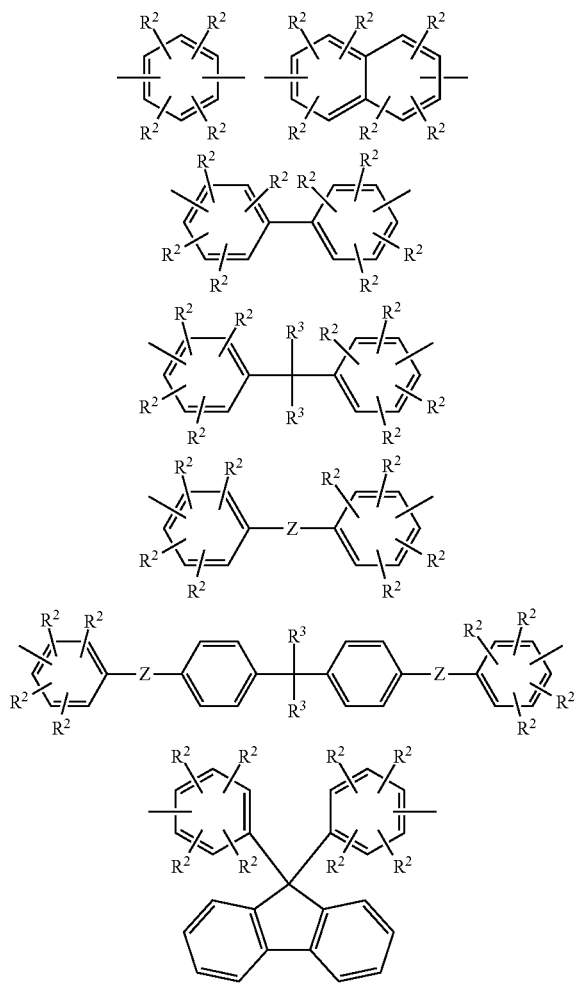

wherein bonds in the above structural formulae that are yet unbonded to substituent groups are to be bonded to nitrogen atoms forming cyclic imide structures in the formula (1).

In the above formulae, each $R^2$ independently represents a hydrogen atom, a halogen atom or an alkyl group having 1 to 6 carbon atoms; preferably a hydrogen atom or an alkyl group having 1 to 6 carbon atoms; more preferably a hydrogen atom, a methyl group or an ethyl group.

In the above formulae, each $R^3$ independently represents a hydrogen atom, a halogen atom, a methyl group or a trifluoromethyl group; preferably a hydrogen atom, a methyl group or a trifluoromethyl group.

In the above formulae, Z represents an oxygen atom, a sulfur atom or a methylene group; preferably an oxygen atom or a sulfur atom.

In the formula (1), X represents a hydrogen atom or a methyl group, preferably a hydrogen atom.

In the formula (1), n is a number of to 300, preferably a number of 10 to 300, more preferably a number of 10 to 100.

In the formula (1), m is a number of 0 to 300, preferably a number of 0 to 100.

In the formula (1), when m=0, the cyclic imide compound as the component (a) is represented by the following formula (3), $$\text{(3)}$$

wherein A, Q, X and n are defined as above in the formula (1).

The cyclic imide compound represented by the formula (1) has a weight-average molecular weight (Mw) of 2,000 to 1,000,000, preferably 3,000 to 500,000, more preferably 5,000 to 300,000, even more preferably 10,000 to 100,000. When the weight-average molecular weight is smaller than 2,000, a strength as a cyclic imide resin composition will decrease; when the weight-average molecular weight is larger than 1,000,000 the reactivity of the cyclic imide groups at the ends will decrease such that it may be difficult to sufficiently cure the composition.

The weight-average molecular weight (Mw) mentioned in this specification refers to a weight-average molecular weight measured by GPC using polystyrene as a reference material, under the following conditions.

GPC Measurement Condition

Developing solvent: Tetrahydrofuran
Flow rate: 0.6 mL/min
Column: TSK Guardcolumn Super H-L
  TSKgel Super H4000 (6.0 mmI.D.×15 cm×1)
  TSKgel Super H3000 (6.0 mmI.D.×15 cm×1)
  TSKgel Super H2000 (6.0 mmI.D.×15 cm×2)
(Columns are all Produced by TOSOH CORPORATION)
Column temperature: 40° C.
Sample injection volume: 20 μL (Sample concentration: 0.5% by mass-tetrahydrofuran solution)
Detector: Differential refractive index detector (RI)

There are no particular restrictions on a method for producing the cyclic imide compound as the component (a) (e.g. maleimide compound, citraconimide compound). For example, the cyclic imide compound may be produced by at first synthesizing an amine terminated compound by reacting an acid anhydride and diamine, and then reacting such amine terminated compound with an excessive amount of maleic anhydride or citraconic anhydride.

Examples of the acid anhydride include pyromellitic anhydride, maleic anhydride, succinic anhydride, 4,4'-carbonyldiphthalic anhydride, 4,4'-diphthalic anhydride, 4,4'-sulfonyldiphthalic anhydride, 4,4'-oxydiphthalic anhydride and 4,4'-(4,4'-isopropylidenediphenoxy)diphthalic anhydride. Any one of these acid anhydrides may be used alone, or two or more of them may be used in combination, depending on, for example, various uses and purposes. In terms of electric property of the cyclic imide compound, it is preferred that the acid anhydride be pyromellitic anhydride, 4,4'-oxydiphthalic anhydride and 4,4'-(4,4'-isopropylidenediphenoxy)diphthalic anhydride.

Examples of the diamine include 2,2-bis(4-(4-aminophenoxy)phenyl)propane, 4,4'-diamino-3,3'-dimethyldiphenylmethane, 4,4'-diamino-3,3'-diethyldiphenylmethane, 4,4'-diaminodiphenyl ether, 4,4'-diamino-3,3',5,5'-tetraethyldiphenylmethane, tetramethyl-1,3-bis(3-aminopropyl)disiloxane, bis[4-(4-aminophenoxy)phenyl]

sulfone, 4,4'-diaminodiphenylmethane, 1,3-bis(4-aminophenoxy)benzene, dimer diamine, octyl diamine, 1,3-di(aminomethyl)cyclohexane, isophoronediamine, 2,4,4-trimethyl-1,6-diamine and 2-methylpentyl diamine. Any one of these diamines may be used alone, or two or more of them may be used in combination, depending on, for example, various uses and purposes. In terms of electric property of the cyclic imide compound, it is preferred that the diamine be 2,2-bis(4-(4-aminophenoxy)phenyl)propane, 4,4'-diamino-3,3'-dimethyldiphenylmethane, 4,4'-diamino-3,3'-diethyldiphenylmethane, 4,4'-diaminodiphenyl ether, 4,4'-diamino-3,3',5,5'-tetraethyldiphenylmethane, dimer diamine and isophoronediamine.

The cyclic imide compound as the component (a) may be a commercially available product; examples of such commercially available product include BMI-6000, BMI-6100 (by Designer Molecules Inc.).

It is preferred that an equivalent of the cyclic imide groups in the component (a) be 200 to 700 g/eq, more preferably 250 to 650 g/eq, more preferably 300 to 600 g/eq, even more preferably 350 to 550 g/eq. It is preferable if the equivalent is within these ranges, because a cured product of the resin composition will exhibit a low relative permittivity and a low dielectric tangent.

In the composition of the present invention, it is preferred that the component (a) be contained in an amount of 40 to 95 parts by mass, more preferably 50 to 90 parts by mass, per 100 parts by mass of resin contents. Here, "resin contents" refers to a total amount of components (a) to (c), and also includes an amount of a component (d) and other additives if they are added; the resin contents do not include an amount of an inorganic filler and an organic filler that are added.

(b) Cyclic Imide Compound Represented by the Following Formula (2) and Having a Weight-Average Molecular Weight of 200 to 2,000

A cyclic imide compound as a component (b) is a main component of the cyclic imide resin composition of the present invention, and is represented by the following formula (2). By containing the component (b), the resin composition will exhibit a higher adhesive force, and a melt viscosity of the resin composition at a high temperature can be lowered due to the small weight-average molecular weight.

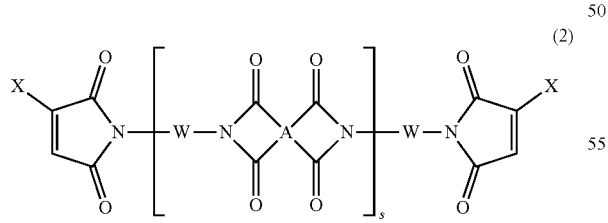

(2)

In the formula (2), independently represents a cyclic structure-containing tetravalent organic group; X represents a hydrogen atom or a methyl group.

Here, the organic group represented by A in the formula (2) independently represents a cyclic structure-containing tetravalent organic group, and it is particularly preferred that this organic group be any one of the tetravalent organic groups represented by the following structural formulae,

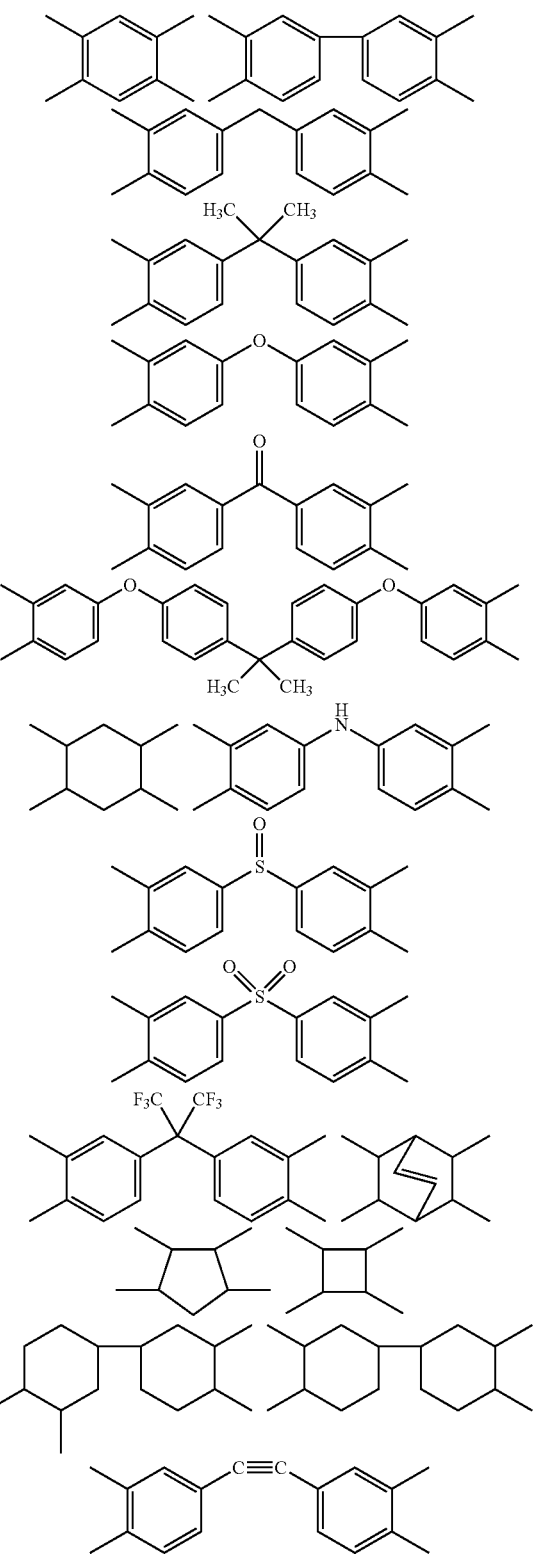

wherein bonds in the above structural formulae that are yet unbonded to substituent groups are to be bonded to carbonyl carbons forming cyclic imide structures in the formula (2).

In the formula (2), W independently represents a divalent aliphatic hydrocarbon group that may contain a hetero atom(s) and has 5 to 20 carbon atoms, preferably a divalent aliphatic hydrocarbon group that may contain a hetero atom(s) and has 6 to 15 carbon atoms; more preferably, there are contained one or more kinds of the divalent aliphatic hydrocarbon groups represented by any of the following structural formulae,

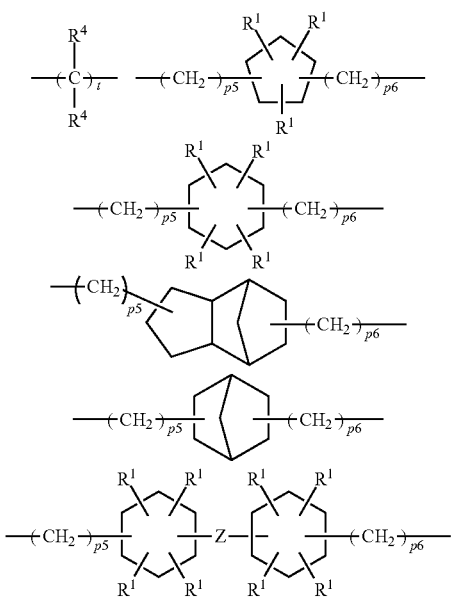

wherein bonds in the above structural formulae that are yet unbonded to substituent groups are to be bonded to nitrogen atoms forming cyclic imide structures in the formula (2).

In the above formulae, each of $p^5$ and $p^6$ represents a number of 0 to 4, preferably a number of 0 to 2; $p^5$ and $p^6$ may be identical to or different from each other. Each $R^1$ independently represents a hydrogen atom or a linear or branched alkyl group having 1 to 20 carbon atoms; preferably a hydrogen atom or a linear or branched alkyl group having 1 to 10 carbon atoms; more preferably a hydrogen atom or a linear alkyl group having 1 to 10 carbon atoms. Z represents an oxygen atom, a sulfur atom or a methylene group. Each $R^4$ independently represents a hydrogen atom, a halogen atom or an alkyl group having 1 to 6 carbon atoms. t is 5 to 12, preferably 6 to 10.

In the formula (2), s is 0 to 10, preferably 0 to 5, more preferably 0 to 3, even more preferably s=0.

The cyclic imide compound represented by the formula (2) has a weight-average molecular weight (Mw) of 200 to 2,000, preferably 250 to 1,500, more preferably 300 to 1,000. When the weight-average molecular weight is larger than 2,000, the melt viscosity of the resin composition at a high temperature will not decrease such that the resin composition may exhibit a poor moldability and adhesiveness.

In the composition of the present invention, it is preferred that the component (b) be contained in an amount of 1 to 60 parts by mass, more preferably 5 to 60 parts by mass, even more preferably 5 to 50 parts by mass, per 100 parts by mass of the component (a).

(c) Curing Catalyst

A component (c) is a curing catalyst, and is to cure the components (a) and (b). While there are no particular restrictions on the component (c), it may, for example, be a thermal radical polymerization initiator or a thermal anion polymerization initiator.

Examples of the thermal radical polymerization initiator include organic peroxides such as methylethylketone peroxide, methylcyclohexanone peroxide, methylacetoacetate peroxide, acetylacetone peroxide, 1,1-bis(t-butylperoxy)3,3,5-trimethylcyclohexane, 1,1-bis(t-hexylperoxy)cyclohexane, 1,1-bis(t-hexylperoxy)3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclododecane, n-butyl-4,4-bis(t-butylperoxy)valerate, 2,2-bis(t-butylperoxy)butane, 1,1-bis(t-butylperoxy)-2-methylcyclohexane, t-butyl hydroperoxide, p-menthane hydroperoxide, 1,1,3,3-tetramethylbutyl hydroperoxide, t-hexyl hydroperoxide, dicumyl peroxide, 2,5-dimethyl-2,5-bis(t-butylperoxy)hexane, α,α'-bis(t-butylperoxy)diisopropylbenzene, t-butylcumyl peroxide, di-t-butyl peroxide, 2,5-dimethyl-2,5-bis(t-butylperoxy)hexine-3, isobutytyl peroxide, 3,5,5-trimethylhexanoyl peroxide, octanoyl peroxide, lauroyl peroxide, cinnamic acid peroxide, m-toluoyl peroxide, benzoyl peroxide, diisopropyl peroxydicarbonate, bis(4-t-butylcyclohexyl)peroxydicarbonate, di-3-methoxybutyl peroxydicarbonate, di-2-ethylhexyl peroxydicarbonate, di-sec-butyl peroxydicarbonate, di(3-methyl-3-methoxybutyl)peroxydicarbonate, di(4l-t-butylcyclohexyl) peroxydicarbonate, α,α'-bis(neodecanoylperoxy) diisopropylbenzene, cumylperoxy neodecanoate, 1,1,3,3-tetramethylbutylperoxy neodecanoate, 1-cyclohhexyl-1-methylethylperoxy neodecanoate, t-hexylperoxy neodecanoate, t-butylperoxy neodecanoate, t-hexylperoxy pivalate, t-butylperoxy pivalate, 2,5-dimethyl-2,5-bis(2-ethylhexanoylperoxy)hexane, 1,1,3,3-tetramethylbutylperoxy-2-ethylhexanoate, 1-cyclohexyl-1-methylethylperoxy-2-ethylhexanoate, t-hexylperoxy-2-ethythexanoate, t-butylperoxy-2-ethylhexanoate, t-butylperoxy isobutyrate, t-butylperoxy maleic acid, t-butylperoxy laurate, t-butylperoxy-3,5,5-trimethylhexanoate, t-butylperoxyisopropyl monocarbonate, t-butylperoxy-2-ethylhexyl monocarbonate, 2,5-dimethyl-2,5-bis(benzoylperoxy)hexane, t-butylperoxy acetate, t-hexylperoxy benzoate, t-butylperoxy-m-toluoyl benzoate, t-butylperoxy benzoate, bis(t-butylperoxy) isophthalate, t-butylperoxy)isophthalate, t-butylperoxyally monocarbonate and 3,3', 4,4'-tetra(t-butylperoxycarbonyl) benzophenone; and azo compounds such as 2,2'-azobis(N-butyl-2-methylpropionamide), 2,2'-azobis(N-cyclohexyl-2-methylpropionamide), 2,2'-azobis[N-(2-methypropyl)-2-methylpropionamide], 2,2'-azobis [N-(2-methylethyl)-2-methylpropionamide], 2,2'-azobis(N-hexyl-2-methylpropionamide), 2,2'-azobis(N-propyl-2-methylpropionamide), 2,2'-azobis(N-ethyl-2-methylpropionamide), 2,2'-azobis[2-methyl-N-(2-hydroxyethyl)propionamide], 2,2'-azobis[N-(2-propenyl)-2-methylpropionamide], 2,2'-azobis{2-methyl-N-[1,1-bis (hydroxymethyl)-2-hydroxyethyl]propionamide}, 2,2'-azobis[N-(2-propenyl)-2-methylpropionamide] and dimethyl-1,1'-azobis(1-cyclohexanecarboxylate).

Examples of the thermal anion polymerization initiator include amine compounds and organic phosphorus compounds. Examples of such amine compounds include imidazoles such as 2-methylimidazole, 2-ethylimidazole, 2-phenylimidazole, 2-ethyl-4-methylimidazole, 2-undecylimidazole, 1-cyanoethyl-2-ethyl-4-methylimidazole and 2,4-diamino-6-[2-(2-methyl-1-imidazolyl)ethyl]-1,3,5-triazine; triethylamine, triethylenediamine; 2-(dimethylaminomethyl)phenol; 1,8-diaza-bicyclo[5,4,0]undecene-7; tris (dimethylaminomethyl)phenol; and benzyldimethylamine.

Examples of such organic phosphorus compounds include triphenylphosphine, tributylphosphine, trioctylphosphine, tetrabutylphosphonium hexafluorophosphate, tetrabutylphosphonium tetraphenylborate, tetrabutylphosphonium acetate, tetraphenylphosphonium tetraphenylborate, tetraphenylphosphonium bromide, tetrabutylphosphonium bromide, tetrabutylphosphonium laurate, tetraphenylphosphonium hydrogen phthalate, bis(tetraphenylphosphonium) dihydrogen pyromellitate and bis(tetrabutylphosphonium) dihydrogen pyromellitate.

Among them, thermal anion polymerization initiators are preferred, of which amine compounds and organic phosphorus compounds are preferred. Among the amine compounds, imidazoles are more preferred; among organic phosphorus compounds, more preferred are tetrabutylphosphonium acetate, tetrabutylphosphonium laurate, tetraphenylphosphonium hydrogen phthalate, bis(tetraphenylphosphonium) dihydrogen pyromellitate and bis(tetrabutylphosphonium) dihydrogen pyromellitate, as phosphonium salts each comprised of a phosphonium cation and one molecule of an anion residue of a carboxylic acid. Further, particularly preferred are 2-ethyl-4-methylimidazole, triphenylphosphine, tetrabutylphosphonium laurate, tetraphenylphosphonium hydrogen phthalate, bis(tetraphenylphosphonium)dihydrogen pyromellitate and bis(tetrabutylphosphonium) dihydrogen pyromellitate.

Any one of these curing catalysts may be used alone, or two or more of them may be used in combination. There are no particular restrictions on the amount of the component (c) added; it is preferred that the component (c) be added in an amount of 0.01 to 10 parts by mass, more preferably 0.1 to 5 parts by mass, even more preferably 0.3 to 5 parts by mass, per 100 parts by mass of the component (a) in the composition of the present invention. When the amount of the component (c) is within these ranges, the resin composition can be cured in a sufficient manner without negatively affecting the properties of the resin composition (d) Epoxy Resin In addition to the components (a) to (c), the present invention may further contain an epoxy resin as a component (d). By containing an epoxy resin, curing will take place faster, and adhesiveness can be further improved. There are no particular restrictions on such epoxy resin, examples of which may include a bisphenol A epoxy resin; a bisphenol F type epoxy resin; a biphenol type epoxy resin such as a 3,3',5,5'-tetramethyl-4,4'-biphenol type epoxy resin and a 4,4'-biphenol type epoxy resin; a biphenol novolac type epoxy resin; a phenol novolac type epoxy resin; a cresol novolac type epoxy resin; a bisphenol A novolac type epoxy resin; a naphthalene diol type epoxy resin; a trisphenylol methane type epoxy resin; a tetrakisphenylol ethane type epoxy resin; a phenol dicyclopentadiene novolac type epoxy resin; an epoxy resin obtained by hydrogenating the aromatic ring(s) of a phenol dicyclopentadiene novolac type epoxy resin; and a biphenyl aralkyl type epoxy resin. Among these examples, preferred are a biphenol novolac type epoxy resin, a phenol novolac type epoxy resin, a cresol novolac type epoxy resin, a bisphenol A novolac type epoxy resin, a phenol dicyclopentadiene novolac type epoxy resin and a biphenyl aralkyl type epoxy resin. Further, if necessary, a given amount of an epoxy resin(s) other than those listed above may be used in combination therewith in accordance with intended purposes.

There are no particular restrictions on the amount of the component (d) added; it is preferred that the component (d) be added in an amount of 0.1 to 30 parts by mass, more preferably 0.5 to 20 parts by mass, per 100 parts by mass of the component (a) in the composition of the present invention. When the amount of the component (d) is within these ranges, the curing speed and adhesiveness of the resin composition can be further improved without negatively affecting the electric properties of the resin composition.

Other Components

Adhesiveness Imparting Agent

The resin composition of the present invention may also contain an adhesiveness imparting agent if necessary, for the purpose of imparting an adhesiveness or a stickiness (pressure sensitive adhesion). Examples of such adhesiveness imparting agent include an acrylic resin, a urethane resin, a phenolic resin, a terpene resin and a silane coupling agent. Particularly, an acrylic resin and a silane coupling agent are preferred if imparting an adhesiveness; a terpene resin is preferred if imparting a stickiness (pressure sensitive adhesion).

There are no particular restrictions on the acrylic resin, examples of which may include lauryl acrylate, stearyl acrylate, isostearyl acrylate, phenoxyethyl acrylate, phenoxydiethylene glycol acrylate, tetrahydrofurfuryl acrylate, isobornyl acrylate, 2-acryloyloxyethyl phthalate, 2-acryloyloxy ethyl phosphate, polyethylene glycol diactylate, dimethylol tricyclodecane diacrylate, trimethylol propane triamilate, dipentaerythritol hexaacrylate, dioxane glycol diactylate, 9,9-bis [4-(2-hydroxyethoxy)phenyl]fluorene diactylate, lauryl methacrylate, phenoxyethyl methacrylate, phenoxydiethylene glycol methacrylate, tetrahydrofurfuryl methacrylate, isobornyl methacrylate, 2-methacryloyloxyethyl phthalate, 2-methacryloyloxyethyl phosphate, polyethylene glycol dimethacrylate and dimethylol tricyclodecane dimethacrylate.

There are no particular restrictions on the terpene resin. Examples of such terpene resin may include homopolymers of terpenes including, for example, monoterpenes such as α-pinene, β-pinene, dipentene and limonene, sesquiterpenes such as cedrene and farnesene, and diterpenes such as abietic acid; aromatic modified terpene resins as copolymers of the aforementioned terpenes and aromatic vinyl compounds such as styrene and α-methylstyrene; and terpene phenol resins as copolymers of the aforementioned terpenes and phenols such as phenol, cresol, hydroquinone, naphthol and bisphenol A. Further, there may also be used, for example, a hydrogenated terpene resin obtained by hydrogenating any of these terpene resins.

There are no particular restrictions on the silane coupling agent, examples of which may include silane coupling agents such as n-propyltrimethoxysilane, n-propyltriethoxysilane, n-octyltrimethoxysilane, n-oetyltriethoxysilane, phenyltrimethoxysilane, phenyltriethoxysilane, methyltrimethoxysilane, methyltriethoxysilane, 2-[methoxy(polyethyleneoxy)propyl]-trimethoxysilane, methoxytri(ethyleneoxy)propyltrimethoxysilane, 3-glycidyloxypropyltrimethoxysilane, 3-glycidoxypropyltrimethoxysilane, 3-aminopropyltrimethoxysilane, N-phenyl-3-aminopropyltrimethoxysilane, 3-mercaptopropyltrimethoxysilane, 3-(methacryloyloxy)propyltrimethoxysilane, 3-isocyanatopropyltriethoxysilane and 3-isocyanatopropyltrimethoxysilane.

There are no particular restrictions on the amount of the adhesiveness imparting agent contained; it is preferred that the adhesiveness imparting agent be contained in an amount of 0.1 to 20 parts by mass, more preferably 0.5 to 10 parts by mass, even more preferably 1 to 5 parts by mass, per 100 parts by mass of the component (a) in the composition of the present invention. When the amount of the adhesiveness imparting agent is within these ranges, the adhesive force or stickiness of the resin composition can be further improved without modifying the mechanical properties of the resin composition.

Antioxidant

There are no particular restrictions on an antioxidant, examples of which may include phenol-based antioxidants such as n-octadecyl-3-(3,5-di-t-butyl-4-hydroxyphenyl)propionate, n-octadecyl-3-(3,5-di-t-butyl-4-hydroxyphenyl)acetate, neododecyl-3-(3,5-di-t-butyl-4-hydroxyphenyl)propionate, dodecyl-β-(3,5-di-t-butyl-4-hydroxyphenyl) propionate, ethyl-α-(4-hydroxy-3,5-di-t-butylphenyl) isobutyrate, octadecyl-α-(4-hydroxy-3,5-di-t-butylphenyl) isobutyrate, octadecyl-α-(4-hydroxy-3,5-di-t-butyl-4-hydroxyphenyl)propionate, 2-(n-octylthio)ethyl-3,5-di-t-butyl-4-hydroxyphenyl acetate, 2-(n-octadecylthio)ethyl-3,5-di-t-butyl-4-hydroxyphenyl acetate, 2-(n-octadecylthio)ethyl-3-(3,5-di-t-butyl-4-hydroxyphenyl)propionate, 2-(2-stearoyloxyethylthio)ethyl-7-(3-methyl-5-t-butyl-4-hydroxyphenyl)heptanoate, 2-hydroxyethyl-7-(3-methyl-5-t-butyl-4-hydroxyphenyl)propionate and pentaerythritol tetrakis[3-(3,5-di-t-butyl-4-hydroxyphenyl)propionate]; sulfur-based antioxidants such as dilauryl-3,3'-thiodipropionate, dimyristyl-3,3'-thiodipropionate, distearyl-3,3'-thiodipropionate, ditridecyl-3,3'-thiodipropionate and pentaerythrityl tetrakis(3-laurylthiopropionate), and phosphorus-based antioxidants such as tridecyl phosphite, triphenyl phosphite, tris(2,4-di-t-butylphenyl)phosphite, 2-ethylhexyldiphenyl phosphite, diphenyl tridecyl phosphite, 2,2-methylenebis(4,6-di-t-butylphenyl)octyl phosphite, distearyl pentaerythritol diphosphite, bis(2,6-di-t-butyl-4-methylphenyl)pentaerythritol diphosphite, and 2-[[2,4,8,10-tetrakis(1,1-dimethylethyl)dibenzo[d,f][1,3,2]dioxaphosphepin-6-yl]oxy]-N,N-bis[2-[[2,4,8,10-tetrakis(1,1-dimethylethyl)dibenzo[d,f][1,3,2]dioxaphosphepin-6-yl]oxy]-ethyl]ethanamine.

There are no particular restrictions on the amount of the antioxidant contained; it is preferred that the antioxidant be contained in an amount of 0.00001 to 5 parts by mass, more preferably 0.0001 to 4 parts by mass, even more preferably 0.001 to 3 parts by mass, per 100 parts by mass of the component (a) in the composition of the present invention. When the amount of the antioxidant is within these ranges, the oxidation of the resin composition can be prevented without modifying the mechanical properties of the resin composition, Flame Retardant There are no particular restrictions on a flame retardant; the flame retardant may, for example, be a phosphorus-based flame retardant, a metal hydrate, a halogen-based flame retardant and a guanidine-based flame retardant. Examples of the phosphorus-based flame retardant include red phosphorus; ammonium phosphates such as monoammonium phosphate, di ammonium phosphate, tri ammonium phosphate and ammonium polyphosphate; inorganic nitrogen-containing phosphorus compounds such as guanidine phosphate and amide phosphate; phosphoric acids; phosphine oxide; triphenyl phosphate; tricresyl phosphate; trixylenyl phosphate; cresyl diphenyl phosphate; cresyl di-2,6-xylenyl phosphate; resorcinol bis(diphenyl phosphate); 1,3-phenylene bis (diphenyl phosphate); bisphenol A-bis(diphenyl phosphate); 1,3-phenylene his(diphenyl phosphate); divinyl phenylphosphonate; diallyl phenylphosphonate; bis(1-butenyl)phenylphosphonate; phenyl diphenylphosphinate; methyl diphenylphosphinate; phosphazene compounds such as bis(2-allylphenoxy)phosphazene and dicresyl phosphazene; melamine phosphate; melamine pyrophosphate; melamine polyphosphate; melam polyphosphate; melem polyphosphate; 9,10-dihydro-9-oxa-10-phosphaphenanthrene-10-oxide; and 10-(2,5-dihydroxyphenyl)-9,10-dihydro-9-oxa-10-phosphaphenanthrene-10-oxide. Examples of the metal hydrate include aluminum hydroxide hydrate and magnesium hydroxide hydrate. Examples of the halogen-based flame retardant include hexabromobenzene, pentabromotoluene, ethylenebis(pentabromophenyl), ethylenebistetrabromophthalimide, 1,2-dibromo-4-(1,2-dibromoethyl) cyclohexane, tetrabromocyclooctane, hexabromocyclododecane, bis(tribromophenoxy)ethane, brominated polyphenylene ether, brominated polystyrene and 2,4,6-tris(tribromophenoxy)-1,3,5-triazine. Examples of the guanidine-based flame retardant include guanidine sulfamate and guanidine phosphate.

There are no particular restrictions on the amount of the flame retardant contained; it is preferred that the flame retardant be contained in an amount of 0.01 to 10 parts by mass, more preferably 0.05 to 8 parts by mass, even more preferably 0.1 to 5 parts by mass, per 100 parts by mass of the component (a) in the composition of the present invention. When the amount of the flame retardant is within these ranges, a flame retardancy can be imparted to the resin composition without modifying the mechanical properties of the resin composition.

Inorganic Filler

There are no particular restrictions on an inorganic filler, examples of which may include metal oxides such as titanium dioxide, yttrium oxide, aluminum oxide, magnesium oxide, zinc oxide and beryllium oxide; metal nitrides such as boron nitride, aluminum nitride and silicon nitride; carbon-containing particles such as silicon carbide particles, diamond particles and graphene particles; hollow particles such as silica balloons (hollow silica), carbon balloons, alumina balloons and aluminosilicate balloons; metal elements such as gold, silver, copper, palladium, aluminum, nickel, iron, cobalt, titanium, manganese, zinc, tungsten, platinum, lead and tin; alloys such as solder, steel and stainless steel; magnetic metal alloys such as stainless steel, a Fe—Cr—Al—Si alloy, a Fe—Si—Al alloy, a Fe—Ni alloy, a Fe—Cu—Si alloy, a Fe—Si alloy, a Fe—Si—B (—Cu—Nb) alloy, a Fe—Si—Cr—Ni alloy, a Fe—Si—Cr alloy and a Fe—Si—Al—Ni—Cr alloy; and ferrites such as hematite ($Fe_2O_3$), magnetite ($Fe_3O_4$), Mn—Zn-based ferrite, Ni—Zn-based ferrite, Mg—Mn-based fenite, Zr—Mn-based ferrite, Ti—Mn-based ferrite, Mn—Zn—Cu-based ferrite, barium ferrite and strontium ferrite. Any one of these inorganic fillers may be used alone, or two or more of them may be used in combination.

By adding metal oxides, metal nitrides and/or carbon-containing particles, the linear expansion coefficient of the cured product of the resin composition can be lowered, and the thermal conductivity thereof can be increased; by adding hollow particles, the relative permittivity, dielectric tangent, density or the like of the cured product of the resin composition can be lowered; by adding metals and/or alloys, the electric conductivity, thermal conductivity or the like of the cured product of the resin composition can be increased; by adding ferrites, electromagnetican wave absorption capability can be imparted to the cured product of the resin composition.

There are no particular restrictions on the shape of the inorganic filler; the inorganic filler may, for example, have a spherical shape, a scale-like shape, a flake-like shape, a needle-like shape, a stick-like shape or an oval shape, among which a spherical shape, a scale-like shape, a flake-like shape, an oval shape and a stick-like shape are preferred, a spherical shape, a scale-like shape, a flake-like shape and an oval shape are more preferred.

There are no particular restrictions on the primary particle size of the inorganic filler; it is preferred that the primary particle size be 0.05 to 500 μm, more preferably 0.1 to 300 μm, even more preferably 1 to 100 μm, as a median size measured by a laser diffraction-type particle size distribution measurement device. It is preferable when the primary particle size is within these ranges, because it will be easy to uniformly disperse the inorganic particles in the resin composition, and the inorganic particles will not precipitate, separate or be unevenly distributed with time.

There are no particular restrictions on the amount of the inorganic filler added; it is preferred that the inorganic filler be added in an amount of 5 to 3,000 parts by mass, more preferably 10 to 2,500 parts by mass, even more preferably 50 to 2,000 parts by mass, per 100 parts by mass of the component (a) in the composition of the present invention. When the amount of the inorganic filler is within these ranges, the functions of the inorganic particles can be sufficiently exhibited while maintaining the strength of the resin composition.

Organic Filler

There are no particular restrictions on an organic filler, examples of which may include thermoplastic resin particles such as particles of an acrylic-butadiene copolymer, a styrene-butadiene copolymer, an acrylonitrile-styrene-butadiene copolymer and an acrylic block copolymer; carbon fibers; cellulose fibers; a silicone powder; an acrylic powder; a polytetrafluoroethylene powder; a polyethylene powder; and a polypropylene powder. Any one of these organic fillers may be used alone, or two or more of them may be used in combination.

There are no particular restrictions on the shape of the organic filler; the organic filler may, for example, have a spherical shape, a fibrous shape, a flake-like shape, a needle-like shape, a stick-like shape or an oval shape, among which a spherical shape, a fibrous shape, a flake-like shape, an oval shape and a stick-like shape are preferred, a spherical shape, a fibrous shape, a flake-like shape and an oval shape are more preferred.

There are no particular restrictions on the primary particle size of the organic filler; it is preferred that the primary particle size be 0.05 to 500 μm, more preferably 0.1 to 300 μm, even more preferably 1 to 100 μm, as a median size measured by a laser diffraction-type particle size distribution measurement device. It is preferable when the primary particle size is within these ranges, because it will be easy to uniformly disperse the organic particles in the resin composition, and the organic particles will not precipitate, separate or be unevenly distributed with time.

There are no particular restrictions on the amount of the organic filler added; it is preferred that the organic filler be added in an amount of 1 to 400 parts by mass, more preferably 5 to 200 parts by mass, even more preferably 10 to 100 parts by mass, per 100 parts by mass of the component (a) in the composition of the present invention. When the amount of the organic filler is within these ranges, the strength of the resin composition can be increased.

Production method

A method for producing the resin composition of the present invention may, for example, be such a method where the components (a) to (c) as well as the component (d) and other additives that are added as necessary are to be mixed using, for example, a planetary mixer (by INOUE MFG., INC.) or a mixer, THINKY CONDITIONING MIXER (by THINKY CORPORATION); preferably a method where an organic solvent (e.g. cyclopentanone, cyclohexanone, mesitylene, anisole, dibutyl ether, diphenyl ether, 1,4-dioxane, N,N-dimethyl formamide, N,N-dimethyl acetoamide, dimethylsulfoxide and N-methylpyrrolidone) is further added before performing mixing. By adding an organic solvent, the viscosity of the resin composition can be lowered so that mixing can be performed in a more uniform manner. The resin composition can be obtained by distilling away such organic solvent under a reduced pressure after mixing; if used as a prepreg or the like, the composition may be used as it is without distilling away the organic solvent, or the concentration there may be adjusted to a desired concentration before use.

Prepreg

The cyclic imide resin composition of the present invention can also be used as a prepreg, by dissolving the composition into a solvent, impregnating a fiber base material with such solvent, and then drying the same by beating.

As the fiber base material, there may be employed a known material used in a laminate. For example, there may be listed an inorganic fiber such as an E glass, S glass, T glass, NE glass and Q glass (quartz glass); and an organic fiber such as polyethylene, polyester, polyamide and polytetrafluoroethylene. Any one of these fibers may be used alone, or two or more of them may be used in combination. Particularly, in terms of dielectric property, an inorganic fiber is preferred; a T glass, NE glass and Q glass are more preferred.

There are no particular restrictions on the thickness of the fiber base material; it is preferred that the thickness of the fiber base material be 5 to 500 μm, more preferably 10 to 100 μl m, even more preferably 20 to 80 μm. When the thickness of the fiber base material is within these ranges, there can be obtained a prepreg having an excellent flexibility, a low warpage and a high strength.

These fiber base materials may be heated and/or surface-treated with a silane coupling agent or the like to improve dielectric properties and an affinity to resin.

There are no particular restrictions on the amount of the resin composition contained in the prepreg; it is preferred that the heat-curable resin composition be contained in an amount of 20 to 90% by volume, more preferably 30 to 80% by volume, even more preferably 40 to 70% by volume. When the amount of the heat-curable resin composition is within these ranges, an adhesion strength to a conductor can be improved while maintaining dielectric properties and a low warpage.

There are no particular restrictions on the thickness of the prepreg of the present invention; it is preferred that the thickness of the prepreg be 10 to 500 μm, more preferably 25 to 300 μm, even more preferably 40 to 200 μm. When the thickness of the prepreg is within these ranges, a copper-clad laminate can be produced in a favorable manner.

The prepreg of the present invention may also be previously heated so as to be semi-cured (B-staged). There are no particular restrictions on a method for reaching B-stage; for example, after dissolving the resin composition of the present invention into a solvent, impregnating a fiber base material such solvent, and then drying the same, B-stage can then be reached by performing heating at 80 to 200° C. for 1 to 30 min.

Copper-Clad Laminate

The abovementioned prepreg and a copper foil may be stacked together, pressed, and then cured by heating, thereby allowing them to be used as a copper-clad laminate. There are no particular restrictions on a method for producing the copper-clad laminate; for example, the copper-clad laminate can be produced by taking 1 to 20 pieces, preferably 2 to 10 pieces of the prepreg, placing a copper foil on one or both surfaces thereof, pressing them, and then curing them by heating.

There are no particular restrictions on the thickness of the copper foil; it is preferred that the thickness of the copper foil be 3 to 70 μm, more preferably 10 to 50 μm, even more preferably 15 to 40 μm. When the thickness of the copper foil is within these ranges, there can be molded a multilayered copper-clad laminate maintaining a high reliability.

There are no particular restrictions on a condition(s) for molding the copper-clad laminate; for example, molding may be carried out using a multistage pressing machine, a multistage vacuum pressing machine, a continuous molding machine, an autoclave molding machine or the like, at a temperature of 100 to 400° C., under a pressure of 1 to 100 MPa, and for a heating time of 0.1 to 4 hours. Further, the copper-clad laminate may also be molded by collectively molding the prepreg of the present invention, a copper foil and a wiring board for inner layers.

Printed-Wiring Board

A circuit may be formed on the aforementioned copper-clad laminate so that it can then be used as a printed-wiring board.

There are no particular restrictions on a method for forming the circuit; for example, the circuit may be formed by a circuit formation method employing a drilling process, a metal plating process, an etching process of a metal foil or the like.

Further, the printed-wiring board may also be produced by a buildup technique where the resin composition or prepreg of the present invention and a copper foil are to be sequentially laminated.

WORKING EXAMPLES

The present invention is described in greater detail hereunder with reference to working and comparative examples; the following working examples shall not limit the scope of the present invention.

A molecular weight mentioned in the working examples is a weight-average molecular weight (Mw) measured by gel permeation chromatography (GPC) using polystyrene as a reference material. Measurement conditions are shown below.

GPC Measurement Condition

Developing solvent: Tetrahydrofuran
Flow rate: 0.6 mL/min
Column: TSK Guardcolumn Super H-L
  TSKgel Super H4000 (6.0 mmI.D.×15 cm×1)
  TSKgel Super H3000 (6.0 minI.D.×15 cm×1)
  TSKgel Super 1-12000 (6.0 minI.D.×15 cm×2)
(Columns are all Produced by TOSOH CORPORATION)
Column temperature: 40° C.
Sample injection volume: 20 μL (Sample concentration: 0.5% by mass-tetrahydrofuran solution)
Detector: Differential refractive index detector (RI)

(a) Cyclic Imide Compound (a-1) Maleimide Compound

Here, 253 g (1.003 mol) of 3,3'-diethyl-4,4'-diaminodiphenylmethane (KAYAHARD A-A by Nippon Kayaku Co., Ltd.) and 520 g (1.0 mol) of 4,4'-(4,4'-isopropylidenediphenoxy)diphthalic anhydride were added to 500 g of anisole, followed by stirring them at room temperature for five hours, and then at 120° C. for another three hours. Next, 19 g (0.2 mol) of maleic anhydride was added to a solution thus obtained, followed by performing stirring at 150° C. for an hour. Later the solvent and unreacted maleic anhydride were distilled away under a reduced pressure to obtain a maleimide (a-1) represented by the following formula (weight-average molecular weight 180,000).

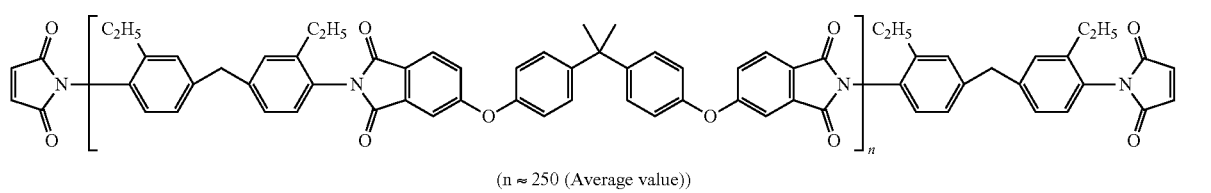

(a-1)

(n ≈ 250 (Average value))

(a-2) Maleimide Compound

Here, 327 g (1.05 mol) of 3,3'5,5'-tetraethyl-4,4'-diaminodiphenylmethane and 310 g (1.0 mol) of 4,4'-oxydiphthalic anhydride were added to 350 g of anisole, followed by stirring them at room temperature for three hours, and then at 120° C. for another three hours. Next, 19 g (0.2 mol) of maleic anhydride was added to a solution thus obtained, followed by performing stirring at 150° C. for an hour. Later, the solvent and unreacted maleic anhydride were distilled away under a reduced pressure to obtain a maleimide (a-2) represented by the following formula (weight-average molecular weight 58,000).

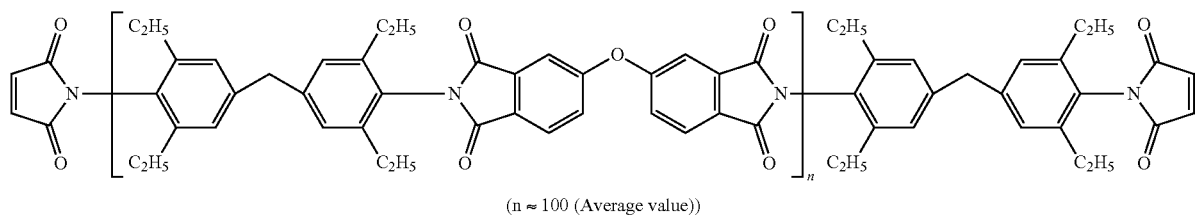

(a-2)

(n ≈ 100 (Average value))

(a-3) Maleimide Compound

Here, 220 g (1.1 mol) of 4,4'-diaminodiphenyl ether and 310 g (1.0 mol) of 4,4'-oxydiphthalic anhydride were added to 300 g of anisole, followed by stirring them at room temperature for five hours, and then at 120° C. for another three hours. Next, 19 g (0.2 mol) of maleic anhydride was added to a solution thus obtained, followed by performing stirring at 150° C. for an hour. Later, the solvent and unreacted maleic anhydride were distilled away under a reduced pressure to obtain a maleimide (a-3) represented by the following formula (weight-average molecular weight 5,000).

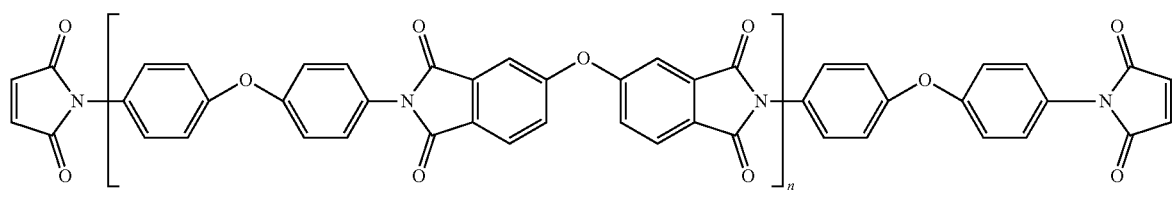

(a-3)

(n ≈ 10 (Average value))

(a-4) Maleimide Compound

Here, 431 g (1.05 mol) of 2,2-bis(4-(4-aminophenoxy) phenyl)propane and 520 g (1.0 mol) of 4,4'-(4,4'-isopropylidenediphenoxy)diphthalic anhydride were added to 500 g of anisole, followed by stirring them at room temperature for five hours, and then at 120° C. for another three hours. Next, 19 g (0.2 mol) of maleic anhydride was added to a solution thus obtained, followed by performing stifling at 150° C. for an hour. Later, the solvent and unreacted maleic anhydride were distilled away under a reduced pressure to obtain a maleimide (a-4) represented by the following formula (weight-average molecular weight 45,000).

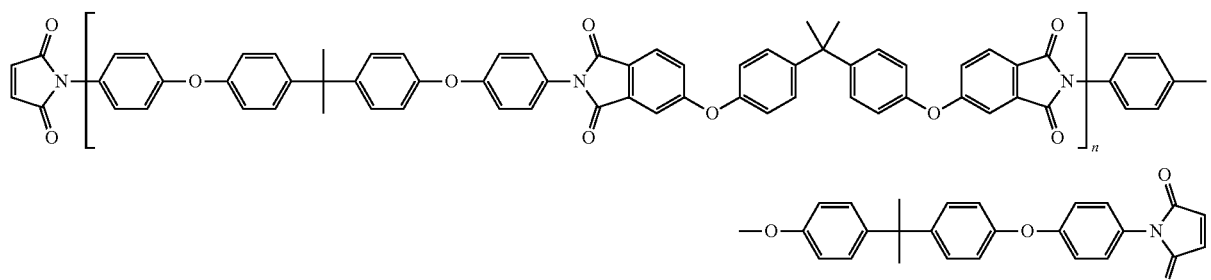

(a-4)

(n ≈ 50 (Average value))

(a-5) Maleimide Compound

Here, 171 g (055 mol) of 3,3',5,5'-tetraethyl-4,4'-diaminodiphenylmethane, 305 g (0.55 mol) of Priamine 1075 (by Croda Japan K.K.) and 310 g (1.0 mol) of 4,4'-oxydiphthalic anhydride were added to 400 g of anisole, followed by stirring them at room temperature for five hours, and then at 120° C. for another three hours. Next, 19 g (0.2 mol) of maleic anhydride was added to a solution thus obtained, followed by performing stirring at 150° C. for an hour. Later, the solvent and unreacted maleic anhydride were distilled away under a reduced pressure to obtain a maleimide (a-5) represented by the following formula (weight-average molecular weight 26,000).

(a-7) Citraconimide Compound

Here, 277 a (1.1 mol) of 3,3'-diethyl-4,4'-diaminodiphenylmethane (KAYAHARD A-A by Nippon Kayaku Co., Ltd.) and 520 g (1.0 mol) of 4,4'-(4,4'-isopropylidenediphenoxy)diphthalic anhydride were added to 350 g of anisole, followed by stirring them at room temperature for three hours, and then at 120° C. for another three hours. Next, 26 g (0.2 mol) of citraconic anhydride was added to a solution thus obtained, followed by performing stirring at 150° C. for an hour. Later, the solvent and unreacted citraconic anhydride were distilled away under a reduced pressure to obtain a citraconimide (a-7) represented by the following formula (weight-average molecular weight 41,000).

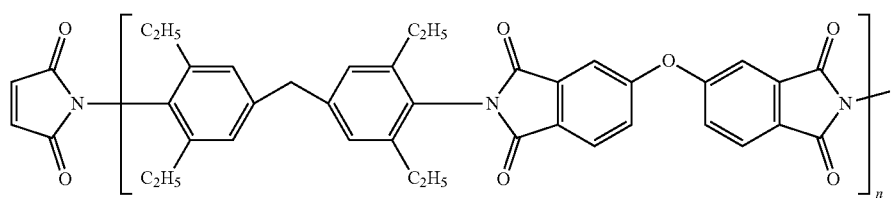

(a-5)

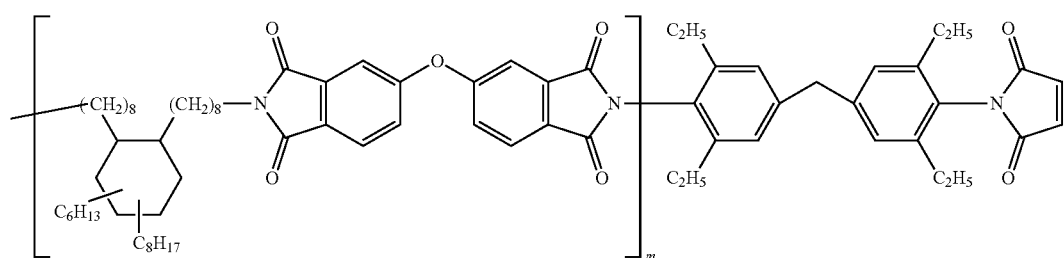

(n ≈ 20 (Average value), m ≈ 20 (Average value))

(a-6) Maleimide Compound

A maleimide compound represented by the following formula (BMI-6100 by Designer Molecules Inc.) (weight-average molecular weight 37,000)

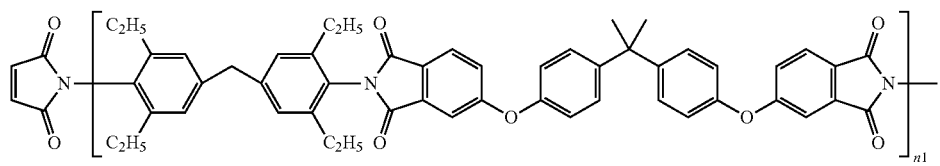

(a-6)

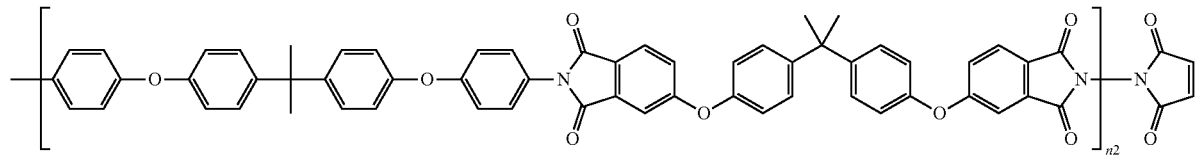

(n1 ≈ 4 (Average value), n2 ≈ 37 (Average value))

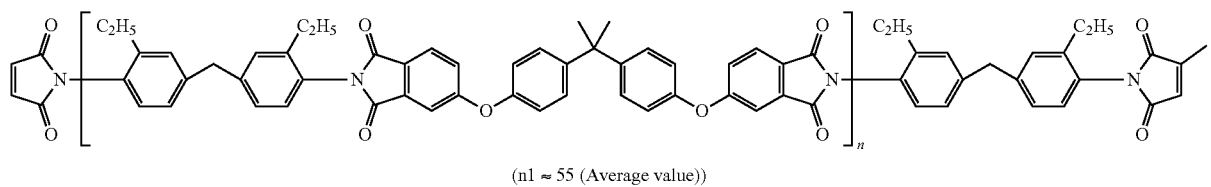

(n1 ≈ 55 (Average value))

(a'-1) Maleimide Compound (for Use in Comparative Example)

Here, 202 g (1.0 mol) of 1,12-diaminododecane and 520 g (1.0 mol) of 4,4'-(4,4'-isopropylidenediphenoxy)diphthalic anhydride were added to 250 g of anisole, followed by stirring them at 25° C. for three hours, and then at 150° C. for another three hours. Next, 196 g (2.0 mol) of maleic anhydride, 82 g (1.0 mol) of sodium acetate and 204 g (2.0 mol) of acetic anhydride were added to a solution thus obtained, followed by performing stirring at 80° C. for an hour. Later, 500 g of toluene was added, followed by performing water washing and dewatering before distilling away the solvent under a reduced pressure, thereby obtaining a maleimide (a'-1) represented by the following formula (weight-average molecular weight 83,000).

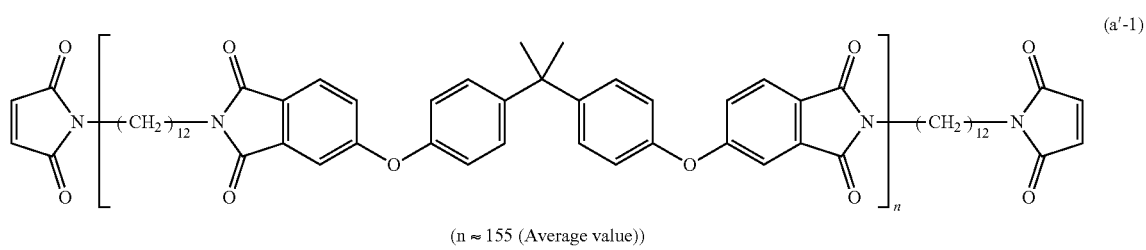

(n ≈ 155 (Average value))

(a'-2) Maleimide Compound (for Use in Comparative Example)

A maleimide compound represented by the following formula (BMI-3000 by Designer Molecules Inc.) (weight-average molecular weight 4,000)

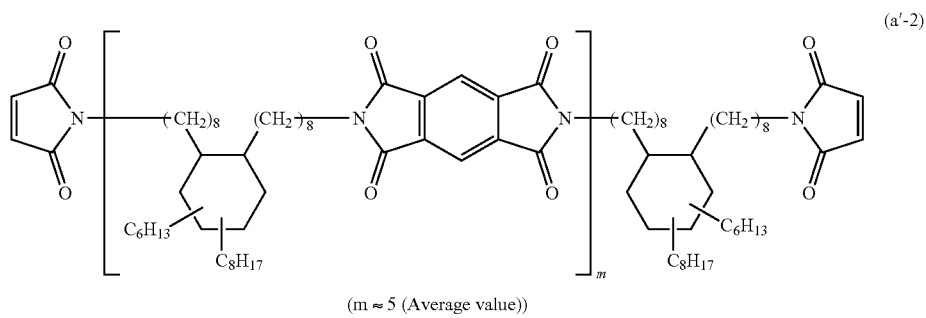

(m ≈ 5 (Average value))

(a'-3) Maleimide Compound (for Use in Comparative Example)

A maleimide compound represented by the following formula (BTI-2300 by Daiwakasei Industry Co., LTD.) (weight-average molecular weight 400)

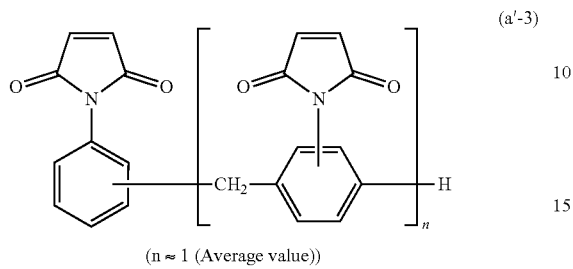

(n ≈ 1 (Average value))

(a'-4) Maleimide Compound (for Use in Comparative Example)

A maleimide compound represented by the following formula (BMI-4000 by Daiwakasei Industry Co., LTD.) (weight-average molecular weight 570)

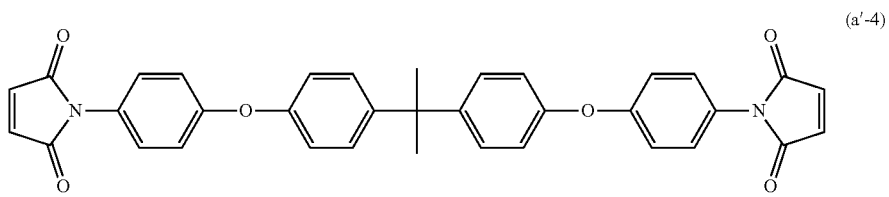 [SMILES: CC(C)(c1ccc(Oc2ccc(N3C(=O)C=CC3=O)cc2)cc1)c1ccc(Oc2ccc(N3C(=O)C=CC3=O)cc2)cc1]

(b) Cyclic Imide Compound (b-1) Maleimide Compound

Here, 202 g (1.0 mol) of 1,12-diaminododecane, 245 g (2.5 mol) maleic anhydride, 82 g (1.0 mol) of sodium acetate and 204 g (2.0 mol) of acetic anhydride were added to 250 g of N-methylpyrrolidone, followed by stirring them at 100° C. for five hours. Later, 500 g of toluene was added, followed by performing water washing and dewatering before distilling away the solvent under a reduced pressure, thereby obtaining a maleimide (b-1) represented by the following formula (weight-average molecular weight 360).

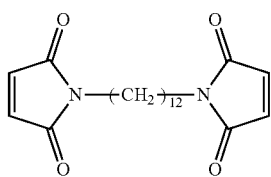

(b-2) Maleimide Compound

Here, 154 g (1.0 mol) of bis(aminomethyl)norbornane, 245 g (2.5 mol) of maleic anhydride, 82 g (1.0 mol) of sodium acetate and 204 g (2.0 mol) of acetic anhydride were added to 250 g of N-methylpyrrolidone, followed by stirring them at 100° C. for five hours. Later, 500 g of toluene was added, followed by performing water washing and dewatering before distilling away the solvent under a reduced pressure, thereby obtaining a maleimide (b-2) represented by the following formula (weight-average molecular weight 320).

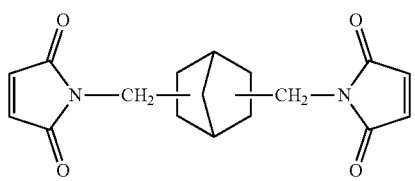

(b-3) Maleimide Compound

Here, 116 g (2.0 mol) of 2-methyl-1,5-pentanediamine and 218 g (1.0 mol) of pyromellitic anhydride were added to 250 g of N-methylpyrrolidone, followed by stirring them at room temperature for three hours, and then at 120° C. for another three hours. Next, 245 g (2.5 mol) of maleic anhydride, 82 g (1.0 mol) of sodium acetate and 204 g (2.0 mol) of acetic anhydride were added to a solution thus obtained, followed by performing stirring at 100° C. for five hours. Later, 500 g of toluene was added, followed by performing water washing and dewatering before distilling away the solvent under a reduced pressure, thereby obtaining a maleimide (b-3) represented by the following formula (weight-average molecular weight 580).

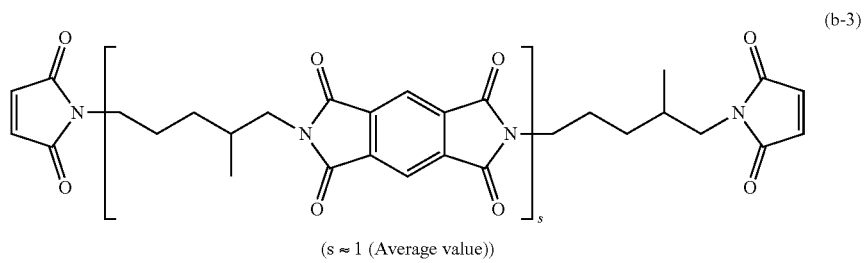

(s ≈ 1 (Average value))

(b-4) Maleimide Compound

A maleimide compound represented by the following formula (BMI-TMH by Daiwakasei Industry Co., LTD.) (weight-average molecular weight 320)

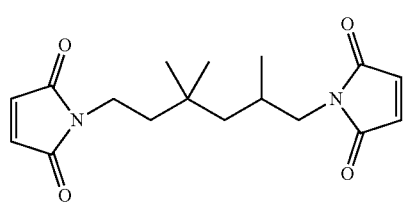

(b-5) Citraconimide Compound

Here, 170 g (1.0 mol) of isophoronediamine, 280 g (2.5 mol) of citraconic anhydride, 82 g (1,0 mol) of sodium acetate and 204 g (2.0 mol) of acetic anhydride were added to 350 g of N-methylpyrrolidone, followed by stirring them at 130° C. for eight hours. Later, 500 g of toluene was added, followed by performing water washing and dewatering before distilling away the solvent under a reduced pressure, thereby obtaining a citraconimide (b-5) represented by the following formula (weight-average molecular weight 360).

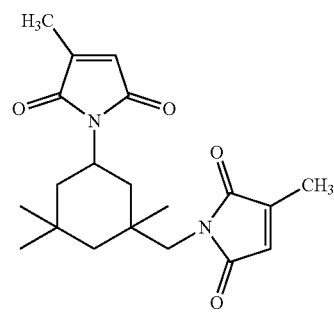

(b'-1) Maleimide Compound (for Use in Comparative Example)

A maleimide compound represented by the following formula (BMI-5100 by Daiwakasei Industry Co., LTD.) (weight-average molecular weight 420)

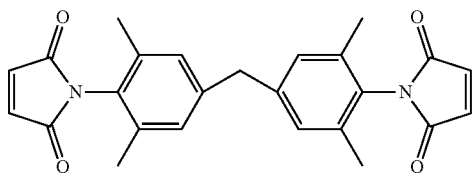

(b'-2) Maleimide Compound (for Use in Comparative Example)

A maleimide compound represented by the following formula (BMI-5000 by Designer Molecules Inc.) (weight-average molecular weight 6,000)

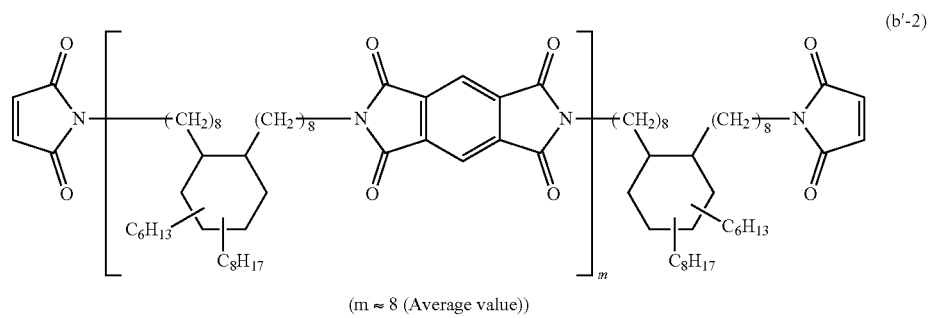

(m ≈ 8 (Average value))

(c) Curing Catalyst (c-1) Tetraphenylphosphonium Hydrogen Phthalate (TPP-phthalic Acid by HOKKO CHEMICAL INDUSTRY CO., LTD.)
(c-2) Bis(tetrabutylphosphonium)dihydrogen Pyromellitate (BTBP-pyromellitic Acid by HOKKO CHEMICAL INDUSTRY CO., LTD.)
(c-3) 2-ethyl-4-methylimidazole
(c-4) Triphenylphosphine (d) Epoxy Resin (d-1) Biphenyl Aralkyl Type Epoxy Resin (NC-3000 by Nippon Kayaku Co., Ltd.)
(d-2) Bisphenol A Type Epoxy Resin (jER-828EL by Mitsubishi Chemical Corporation)

(e) Inorganic Filler (e-1) Silica "SFP-130MC" (Median Size of Primary Particle Size 0.6 μm) (by Denka Company Limited)
(e-2) Alumina "AO-41R" (Median Size of Primary Particle Size 6 μm) (by Admatechs Company Limited)

(f) Organic Filler (f-1) Silicone Powder "KMP-600" (Median Size of Primary Particle Size 5 μm) (by Shin-Etsu Chemical Co., Ltd.)

(g) Adhesiveness Imparting Agent (g-1) Silane Coupling Agent (3-glycidoxypropyltrimethoxysilane, "KBM-403" by Shin-Etsu Chemical Co., Ltd.)
(g-2) Silane Coupling Agent (N-phenyl-3-aminopropyltrimethoxysilane, "KBM-573" by Shin-Etsu Chemical Co., Ltd.)

(h) Antioxidant (h-1) Pentaerythritol Tetrakis[3-(3,5-di-1-butyl-4-hydroxyphenyl)propionate] (ADEKA STAB AO-60 by ADEKA Corporation)

(i) Flame Retardant (i-1) Guanidine Phosphate (APINON-303 by Sanwa Chemical Co., Ltd)

Method for Preparing Resin Composition

In working examples 1 to 21 and comparative examples 1 to 7, in addition to the components of the given compounding ratios (parts by mass) shown in Tables 1-1, 1-2 and 2, 100 parts by mass of cyclopentanone was further added to and mixed therewith per 100 parts by mass of a sum total of those components, followed by using a planetary mixer (by INOUE MFG., INC.) to knead them at 80° C. for 30 min, and then cooling the kneaded product to 25° C. A solution thus obtained was moved to a flask, and the solvent vas then distilled away under a reduced pressure, thereby obtaining a resin composition.

Tensile Strength and Elongation at Break of Cured Product

By performing press cure on an uncured resin composition obtained in each of the working examples 1 to 21 and comparative examples 1 to 7 at 200° C. for four hours, there was produced a test sample (cured product) having a size of 150 mm×200 mm×thickness 50 μm. In accordance with JIS K 6251:2010, and using EZ TEST (EZ-L by Shimadzu Corporation), a tensile strength (MPa) and an elongation at break (%) of the test sample (cured product) were measured under a conditions) of testing rate 500 mm/min; gripping distance 80 mm; gauge length 40 mm. The results thereof are shown in Tables 1 and 2.

Relative Permittivity and Dielectric Tangent

The uncured resin composition prepared was put into a molding frame of a size of 30 mm×40 mm×thickness 100 μm, followed by performing press cure thereon at 200° C. for four hours, thereby obtaining a test sample (cured product). A network analyzer (E5063-2D5 by Keysight Technologies) and a stripline (by KEYCOM Corporation) were connected to the test sample produced to measure a relative permittivity and a dielectric tangent thereof at a frequency of 10 GHz. The results thereof are shown in Tables 1-1, 1-2 and 2.

Heat Resistance

The test sample (cured product) produced to measure the above dielectric properties was left at 180° C. for 1,000 hours, followed by measuring the relative permittivity and dielectric tangent thereof at the frequency of 10 GHz by a method similar to the method described above. The results thereof are shown in Tables 1-1, 1-2 and 2.

Peeling Strength

The uncured resin composition prepared by the above method was applied so that it would be turned into the shape of a film having a thickness of 25 μm, followed by stacking an SUS plate, this film and a copper foil (TQ-M4-VSP by MITSUI MINING & SMELTING CO., LTD.) having a thickness of 18 μm in such order so as to press them, and then performing heating at 200° C. for four hours so as to cure the film. In accordance with JIS-C-6481:1996 which is a standard for test methods of copper-clad laminates for printed wiring boards, a TENSILON tester (STROGRAPH VE-1D by Toyo Seiki Seisaku-sho, Ltd.) was used to measure a force (kN/m) for peeling the copper foil from the resin film at a width of 10 mm, in a 90° direction and at a rate of 50 mm/min. The results thereof are shown in Tables 1-1, 1-2 and 2.

Glass-Transition Temperature

A storage elastic modulus (MPa) of the test sample cured product) produced in the mariner as described in "Tensile strength and elongation at break of cured product" was measured by DMA Q800 (by TA Instruments) in a range of 0 to 300° C. A value of Tan δ was calculated from the value of the storage elastic modulus thus obtained and the value of a loss elastic modulus, and was plotted on a graph from which a peak top temperature was then obtained and regarded as the glass-transition temperature (Tg). The measurement was performed under a condition(s) of: test sample (cured product) of a size of 20 mm×5 mm×thickness 50 μm; rate of temperature rise 5° C./min; multifrequency mode; tension mode; amplitude 15 μm. The results thereof are shown in Tables 1-1, 1-2 and 2.

Melt Viscosity

After applying the uncured resin composition so that it would be turned into the shape of a film having a thickness of 100 μm, the film was then cut into pieces of a size of 10 mm×10 mm, followed by carrying out a measurement using a dynamic viscoelasticity measurement device (Rheometer MR-300 by UBM). The measurement was carried out wider a condition(s) of: measurement frequency 1.0 Hz; probe diameter 8.0 mm; measurement temperature 30 to 200° C. rate of temperature rise 5° C./min. There were read a temperature exhibiting the lowest viscosity (lowest melt viscosity temperature (° C.)) and the value of the melt viscosity at that time (lowest melt viscosity (Pa.$)). The results thereof are shown in Tables 1-1, 1-2 and 2.

TABLE 1-1

| | | | Working example 1 | Working example 2 | Working example 3 | Working example 4 | Working example 5 | Working example 6 | Working example 7 | Working example 8 | Working example 9 | Working example 10 |
|---|---|---|---|---|---|---|---|---|---|---|---|---|
| (a) | (a-1) | | 100 | | | | | | | | 100 | 100 |
| | (a-2) | | | 100 | | | | | | | | |
| | (a-3) | | | | 100 | | | | | | | |
| | (a-4) | | | | | 100 | | | | 100 | | |
| | (a-5) | | | | | | 100 | | | | | |
| | (a-6) | | | | | | | 100 | | | | |
| | (a-7) | | | | | | | | 100 | | | |
| | (a'-1) | | | | | | | | | | | |
| | (a'-2) | | | | | | | | | | | |
| | (a'-3) | | | | | | | | | | | |
| | (a'-4) | | | | | | | | | | | |
| (b) | (b-1) | | 30 | 40 | 50 | 40 | 20 | 5 | 30 | 70 | | |
| | (b-2) | | | | | | | | | | 20 | |
| | (b-3) | | | | | | | | | | | 30 |
| | (b-4) | | | | | | | | | | | |
| | (b-5) | | | | | | | | | | | |
| | (b'-1) | | | | | | | | | | | |
| | (b'-2) | | | | | | | | | | | |
| (c) | (c-1) | | 1 | | 0.5 | | | 0.3 | | | | |
| | (c-2) | | | 2 | | | | | 1 | | 1 | |
| | (c-3) | | | | | 2 | | | | 2 | | 2 |
| | (c-4) | | | | | | 5 | | | | | |
| (d) | (d-1) | | | | | | | | | | | |
| | (d-2) | | | | | | | | | | | |
| (e) | (e-1) | | | | | | | | | | | |
| | (e-2) | | | | | | | | | | | |
| (f) | (f-1) | | | | | | | | | | | |
| (g) | (g-1) | | | | | | | | | | | |
| | (g-2) | | | | | | | | | | | |
| (h) | (h-1) | | | | | | | | | | | |
| (i) | (i-1) | | | | | | | | | | | |
| Evaluation results | Tensile strength | MPA | 80 | 100 | 120 | 60 | 60 | 90 | 110 | 40 | 90 | 70 |
| | Elongation at break | % | 10 | 5 | 5 | 5 | 5 | 10 | 5 | 5 | 5 | 10 |
| | Relative permittivity (10 GHz) | | 2.8 | 2.9 | 3.0 | 2.7 | 2.6 | 2.9 | 2.9 | 3.0 | 2.8 | 2.9 |
| | Dielectric tangent (10 GHz) | | 0.004 | 0.006 | 0.006 | 0.004 | 0.003 | 0.005 | 0.006 | 0.005 | 0.004 | 0.004 |
| | Relative permittivity after heat resistance test | | 2.9 | 2.9 | 3 | 2.8 | 2.8 | 2.9 | 2.9 | 3.1 | 2.9 | 2.9 |
| | Dielectric tangent after heat resistance test | | 0.005 | 0.006 | 0.005 | 0.005 | 0.006 | 0.005 | 0.006 | 0.006 | 0.004 | 0.004 |
| | Peeling strength | kN/m | 1.0 | 0.8 | 0.8 | 1.0 | 1.2 | 0.8 | 0.9 | 1.2 | 0.9 | 0.9 |
| | Glass-transition temperature | ° C. | 180 | 220 | 250 | 180 | 170 | 190 | 220 | 160 | 200 | 190 |
| | Lowest melt viscosity temperature | ° C. | 130 | 150 | 150 | 120 | 130 | 130 | 150 | 120 | 140 | 150 |
| | Lowest melt viscosity | Pa · s | 30 | 45 | 50 | 10 | 15 | 40 | 30 | 5 | 45 | 40 |

TABLE 1-2

| | | | Working example 11 | Working example 12 | Working example 13 | Working example 14 | Working example 15 | Working example 16 | Working example 17 | Working example 18 | Working example 19 | Working example 20 | Working example 21 |
|---|---|---|---|---|---|---|---|---|---|---|---|---|---|
| (a) | (a-1) | | 100 | 100 | | | | | 50 | 60 | 100 | | 100 |
| | (a-2) | | | | 40 | | | | | | | | |
| | (a-3) | | | | 10 | | | | | | | | |
| | (a-4) | | | | 50 | 60 | | 100 | | | | 80 | |
| | (a-5) | | | | | 40 | | | | 40 | | | |
| | (a-6) | | | | | | | | 50 | | | 20 | |
| | (a-7) | | | | | | 100 | | | | | | |
| | (a'-1) | | | | | | | | | | | | |
| | (a'-2) | | | | | | | | | | | | |
| | (a'-3) | | | | | | | | | | | | |
| | (a'-4) | | | | | | | | | | | | |
| (b) | (b-1) | | | | 20 | | | | | 30 | 20 | | |
| | (b-2) | | | | | 10 | | | | | | | 10 |
| | (b-3) | | | | | 10 | | | | | | 10 | 10 |
| | (b-4) | | | 30 | | | | | 30 | 40 | | | 10 |
| | (b-5) | | | 40 | | | 20 | | | | | | |
| | (b'-1) | | | | | | | | | | | | |
| | (b'-2) | | | | | | | | | | | | |
| (c) | (c-1) | | 2 | 2 | | | 1 | | 1 | | 2 | | 3 |
| | (c-2) | | | | | | 1 | | | 4 | | 2 | |
| | (c-3) | | | | 1 | 1 | | | | | | | |
| | (c-4) | | | | | | | 1 | 1 | | | | |
| (d) | (d-1) | | | | | 5 | | 1 | | 5 | 8 | | 10 |
| | (d-2) | | | | | | 10 | | 3 | | | | |
| (e) | (e-1) | | | | | | | | 50 | | | | |
| | (e-2) | | | | | | | | | 100 | | | |
| (f) | (f-1) | | | | | | | | | | 10 | | |
| (g) | (g-1) | | | | | | | | 1 | | | | |
| | (g-2) | | | | | | | | | 2 | | | |
| (h) | (h-1) | | | | | | | | | | | 1 | |
| (i) | (i-1) | | | | | | | | | | | | 6 |
| Evaluation results | Tensile strength | MPA | 80 | 100 | 70 | 70 | 120 | 70 | 130 | 130 | 90 | 90 | 90 |
| | Elongation at break | % | 10 | 5 | 5 | 10 | 5 | 5 | 5 | 5 | 5 | 10 | 10 |
| | Relative permittivity (10 GHz) | | 2.7 | 2.7 | 2.8 | 2.6 | 2.9 | 2.7 | 3.1 | 4.1 | 2.9 | 2.8 | 2.9 |
| | Dielectric tangent (10 GHz) | | 0.003 | 0.003 | 0.005 | 0.003 | 0.005 | 0.004 | 0.002 | 0.003 | 0.005 | 0.005 | 0.006 |
| | Relative permittivity after heat resistance test | | 2.8 | 2.8 | 2.8 | 2.7 | 2.9 | 2.8 | 3.1 | 4.1 | 3.0 | 2.9 | 3.0 |
| | Dielectric tangent after heat resistance test | | 0.004 | 0.004 | 0.005 | 0.004 | 0.006 | 0.005 | 0.003 | 0.003 | 0.006 | 0.005 | 0.006 |
| | Peeling strength | kN/m | 0.9 | 0.8 | 0.8 | 1.2 | 0.8 | 0.9 | 0.8 | 0.8 | 0.9 | 1.0 | 1.2 |
| | Glass-transition temperature | °C. | 190 | 210 | 200 | 180 | 250 | 190 | 200 | 200 | 180 | 190 | 190 |
| | Lowest melt viscosity temperature | °C. | 150 | 150 | 140 | 120 | 160 | 130 | 150 | 150 | 130 | 130 | 130 |
| | Lowest melt viscosity | Pa·s | 40 | 20 | 40 | 10 | 50 | 30 | 50 | 45 | 40 | 30 | 20 |

TABLE 2

| | | Comparative example 1 | Comparative example 2 | Comparative example 3 | Comparative example 4 | Comparative example 5 | Comparative example 6 | Comparative example 7 |
|---|---|---|---|---|---|---|---|---|
| (a) | (a-1) | 100 | | | | | 100 | 100 |
| | (a-2) | | | | | | | |
| | (a-3) | | | | | | | |

TABLE 2-continued

|  |  |  | Comparative example 1 | Comparative example 2 | Comparative example 3 | Comparative example 4 | Comparative example 5 | Comparative example 6 | Comparative example 7 |
|---|---|---|---|---|---|---|---|---|---|
|  | (a-4) |  |  |  |  |  |  |  |  |
|  | (a-5) |  |  |  |  |  |  |  |  |
|  | (a-6) |  |  |  |  |  |  |  |  |
|  | (a'-1) |  |  | 100 |  |  |  |  |  |
|  | (a'-2) |  |  |  | 100 |  |  |  |  |
|  | (a'-3) |  |  |  |  | 100 |  |  |  |
|  | (a'-4) |  |  |  |  |  | 100 |  |  |
| (b) | (b-1) |  |  | 20 |  | 30 | 10 |  |  |
|  | (b-2) |  |  |  | 10 |  |  |  |  |
|  | (b-3) |  |  |  |  |  |  |  |  |
|  | (b-4) |  |  |  |  |  |  |  |  |
|  | (b-5) |  |  |  |  |  |  |  |  |
|  | (b'-1) |  |  |  |  |  |  | 20 |  |
|  | (b'-2) |  |  |  |  |  |  |  | 10 |
| (c) | (c-1) |  | 5 |  | 2 |  |  | 4 |  |
|  | (c-2) |  |  | 2 |  | 3 | 2 |  |  |
|  | (c-3) |  |  |  |  |  |  |  |  |
|  | (c-4) |  |  |  |  |  |  |  |  |
| (d) | (d-1) |  |  |  | 5 |  |  | 2 |  |
|  | (d-2) |  |  |  |  | 10 |  |  | 1 |
| (e) | (e-1) |  |  |  |  |  |  |  |  |
|  | (e-2) |  |  |  |  |  |  |  |  |
| (f) | (f-1) |  |  |  |  |  |  |  |  |
| (g) | (g-1) |  |  |  |  |  |  |  |  |
|  | (g-2) |  |  |  |  |  |  |  |  |
| (h) | (h-1) |  |  |  |  |  |  |  |  |
| (i) | (i-1) |  |  |  |  |  |  |  |  |
| Evaluation results | Tensile strength | MPa | 80 | 30 | 20 | 5 | — | 80 | 10 |
|  | Elongation at break | % | 15 | 80 | 120 | 5 | — | 10 | 5 |
|  | Relative permittivity (10 GHz) |  | 2.9 | 2.7 | 2.5 | 3.1 | — | 2.9 | 2.7 |
|  | Dielectric tangent (10 GHz) |  | 0.005 | 0.003 | 0.002 | 0.009 | — | 0.007 | 0.004 |
|  | Relative permittivity after heat resistance test |  | 2.9 | 3.1 | 2.9 | 3.1 | — | 2.9 | 2.9 |
|  | Dielectric tangent after heat resistance test |  | 0.005 | 0.01 | 0.02 | 0.009 | — | 0.007 | 0.007 |
|  | Peeling strength | kN/m | 0.4 | 1.3 | 1.5 | 0.3 | — | 0.3 | 0.6 |
|  | Glass-transistion temperature | ° C. | 200 | 110 | 60 | 250 | — | 260 | 40, 200 |
|  | Lowest melt viscosity temperature | ° C. | 160 | 100 | 100 | 110 | 100 | 150 | 100 |
|  | Lowest melt viscosity | Pa · s | 90 | 5 | 2 | 10 | 5 | 80 | 15 |

In the working examples 1 to 21, each composition exhibited a low melt viscosity, and the cured product thereof exhibited a low relative permittivity, a low dielectric tangent, a high heat resistance, a high glass-transition temperature and a high adhesion.

In the comparative example 1, since the component (b) was not contained, a high melt viscosity and a poor adhesiveness were observed.

In the comparative examples 2 and 3, since the component (a) was a maleimide resin containing no arylene groups, a low tensile strength and a poor heat resistance were observed.

In the comparative examples 4 and 5, since the molecular weight of the component (a) was so small that it was smaller than 2,000, a low tensile strength of the cured product was observed, and a poor adhesiveness was observed as well. Further, in the comparative example 5, the cured product was extremely brittle to the extent that it broke; properties of the cured product were unable to be measured.

In the comparative example 6, since the component (b) vas an aromatic maleimide resin, a poor adhesiveness was observed.

In the comparative example 7, since the molecular weight of the component (b) was so large that it was larger than 2,000, the component (b) separated from the component (a), and a low tensile strength was observed. Further, since separation had occurred in the cured product, there were observed two glass-transition temperatures.

What is claimed is:

1. A cyclic imide resin composition comprising:
   (a) a cyclic imide compound represented by the following formula (3), and having a weight-average molecular weight of 3,000 to 500,000,

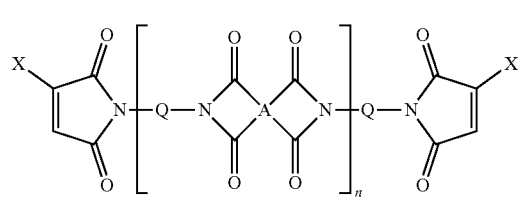
(3)

wherein A independently represents a cyclic structure-containing tetravalent organic group, Q independently represents an arylene group that may contain a hetero atom(s) and has 6 or more carbon atoms, X represents a hydrogen atom or a methyl group, n is 10 to 300;

(b) a cyclic imide compound represented by the following formula (2), and having a weight-average molecular weight of 200 to 2,000,

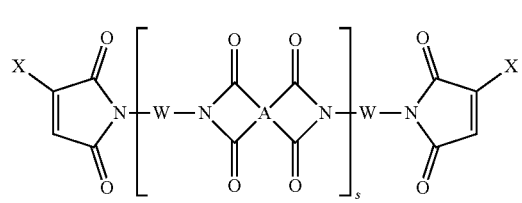
(2)

wherein A independently represents a cyclic structure-containing tetravalent organic group, X represents a hydrogen atom or a methyl group, W independently represents a divalent aliphatic hydrocarbon group that may contain a hetero atom(s) and has 5 or more carbon atoms, s is 1 to 10; and (c) a curing catalyst which is a phosphonium salt comprised of a phosphonium cation and one molecule of an anion residue of a carboxylic acid.

2. The cyclic imide resin composition according to claim 1, wherein the organic group represented by A in the formula (3) is any one of the tetravalent organic groups expressed by the following structural formulae:

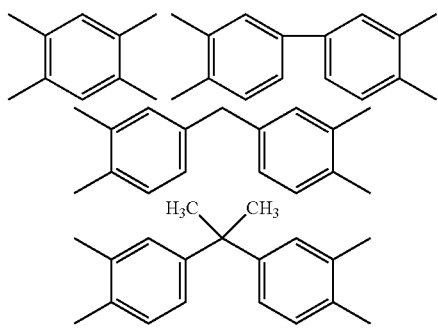

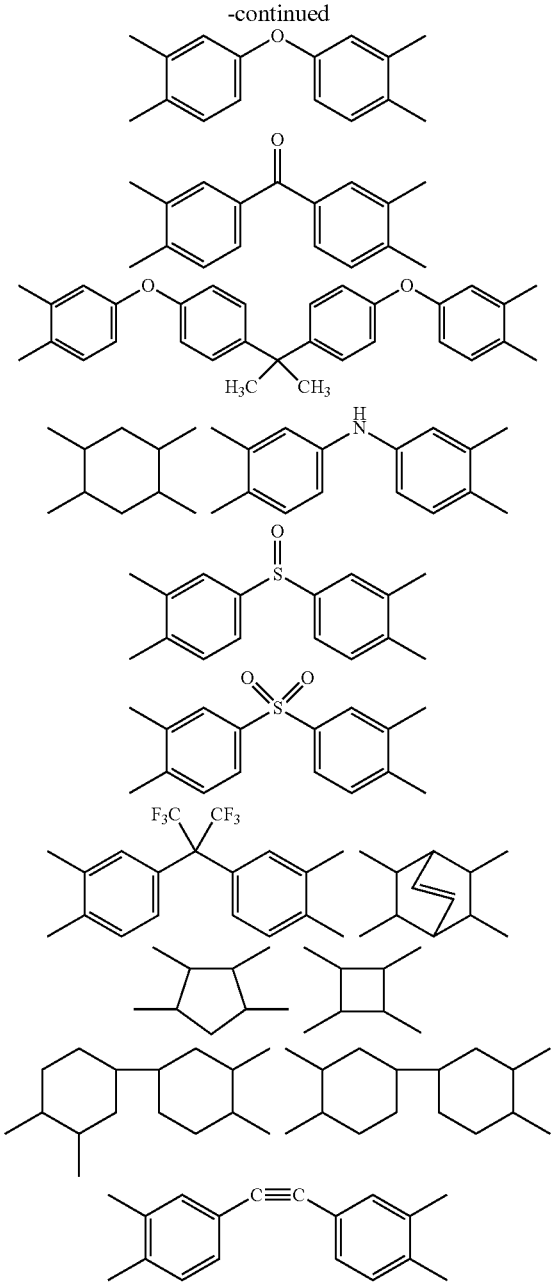

wherein bonds in the above structural formulae that are yet unbonded to substituent groups are to be bonded to carbonyl carbons forming cyclic imide structures in the formula (3).

3. The cyclic imide resin composition according to claim 1, wherein the arylene group represented by Q in the formula (3) is any one of the arylene groups expressed by the following structural formulae:

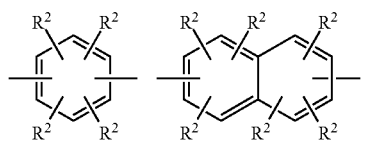

-continued

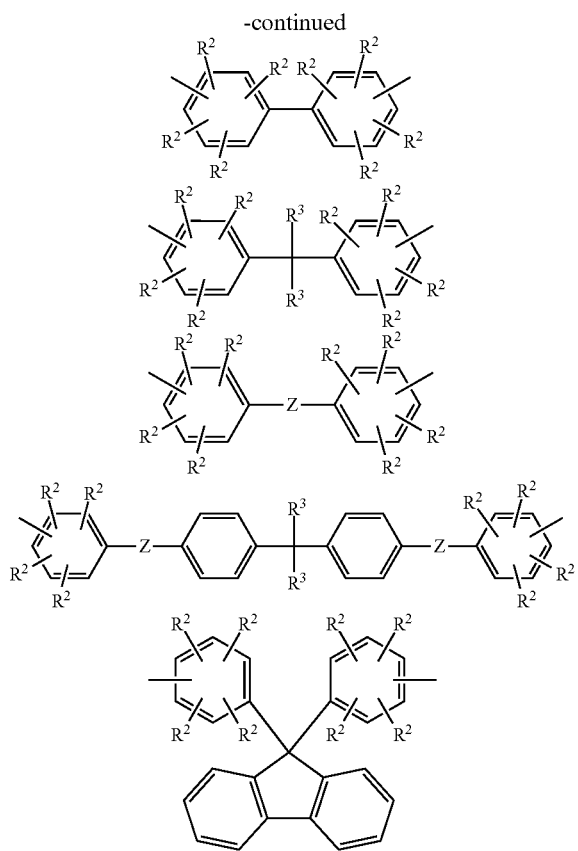

wherein each $R^2$ independently represents a hydrogen atom, a halogen atom or an alkyl group having 1 to 6 carbon atoms; each $R^3$ independently represents a hydrogen atom, a halogen atom, a methyl group or a trifluoromethyl group; Z represents an oxygen atom, a sulfur atom or a methylene group; bonds in the above structural formulae that are yet unbonded to substituent groups are to be bonded to nitrogen atoms forming cyclic imide structures in the formula (3).

4. The cyclic imide resin composition according to claim 1, wherein the divalent aliphatic hydrocarbon group represented by W in the formula (2) is any one of the divalent aliphatic hydrocarbon groups expressed by the following structural formulae:

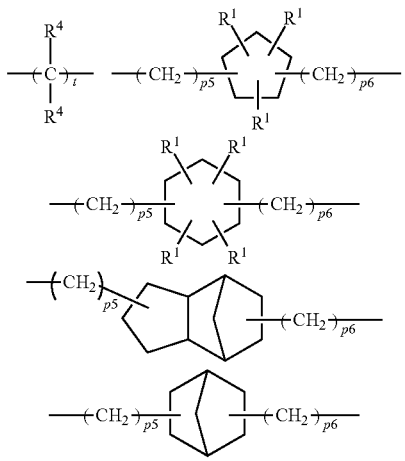

-continued

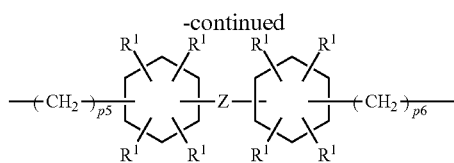

wherein $p^5$ and $p^6$ each represent a number of 0 or larger, and may be identical to or different from each other; each $R^1$ independently represents a hydrogen atom or a linear or branched alkyl group having 1 to 20 carbon atoms; Z represents an oxygen atom, a sulfur atom or a methylene group; $R^4$ represents a hydrogen atom, a halogen atom or an alkyl group having 1 to 6 carbon atoms; t is 5 to 12; bonds in the above structural formulae that are yet unbonded to substituent groups are to be bonded to nitrogen atoms forming cyclic imide structures in the formula (2).

5. The cyclic imide resin composition according to claim 1, further comprising an epoxy resin as a component (d).

6. A prepreg comprising the cyclic imide resin composition according to claim 1.

7. A copper-clad laminate comprising the prepreg according to claim 6.

8. A printed-wiring board comprising the copper-clad laminate according to claim 7.

9. The cyclic imide resin composition according to claim 1, wherein the composition does not contain a photo initiator.

10. The cyclic imide resin composition according to claim 1, wherein the cyclic imide compound represented by the formula (3) has a weight-average molecular weight of 10,000 to 100,000.

11. The cyclic imide resin composition according to claim 1, wherein an equivalent of the cyclic imide groups in the component (a) is 200 to 700 g/eq.

12. The cyclic imide resin composition according to claim 1, wherein the divalent aliphatic hydrocarbon group represented by W in the formula (2) is any one of the divalent aliphatic hydrocarbon groups expressed by the following structural formulae:

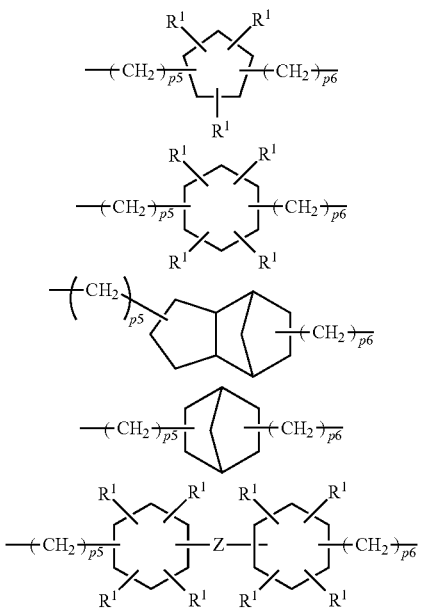

wherein $p^5$ and $p^6$ each represent a number of 0 or larger, and may be identical to or different from each other; each $R^1$ independently represents a hydrogen atom or a linear or branched alkyl group having 1 to 20 carbon atoms; Z represents an oxygen atom, a sulfur atom or a methylene group; bonds in the above structural formulae that are yet unbonded to substituent groups are to be bonded to nitrogen atoms forming cyclic imide structures in the formula (2).

13. The cyclic imide resin composition according to claim 1, wherein the curing catalyst consists of said phosphonium salt.

14. The cyclic imide resin composition according to claim 1, wherein the only initiators in said composition are thermal radical polymerization initiators and/or a thermal anion polymerization initiators.

15. The cyclic imide resin composition according to claim 1, wherein the only initiators in said composition are thermal anion polymerization initiators.

16. A cyclic imide resin composition comprising:
(a) a cyclic imide compound represented by the following formula (1), and having a weight-average molecular weight of 2,000 to 1,000,000,

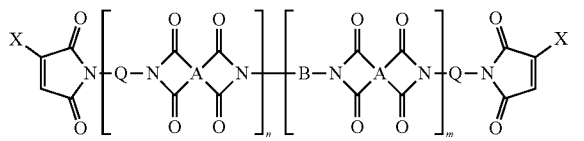
(1)

wherein A independently represents a cyclic structure-containing tetravalent organic group, B independently represents a divalent hydrocarbon group that may contain a hetero atom(s) and has 6 or more carbon atoms, Q independently represents an arylene group that may contain a hetero atom(s) and has 6 or more carbon atoms, X represents a hydrogen atom or a methyl group, n is 1 to 300, m is 0 to 300;

(b) a cyclic imide compound represented by the following formula (2), and having a weight-average molecular weight of 200 to 2,000,

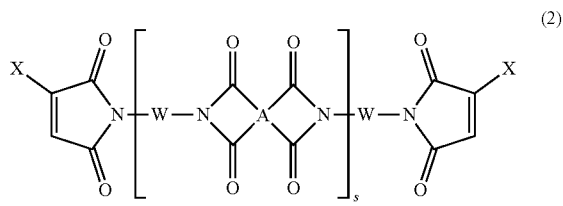
(2)

wherein A independently represents a cyclic structure-containing tetravalent organic group, X represents a hydrogen atom or a methyl group, W independently represents a divalent aliphatic hydrocarbon group that may contain a hetero atom(s) and has 5 or more carbon atoms, s is 0 to 10; and (c) a curing catalyst which is a phosphonium salt comprised of a phosphonium cation and one molecule of an anion residue of a carboxylic acid, wherein the cyclic imide compound (b) is represented by the following formula (b-3):

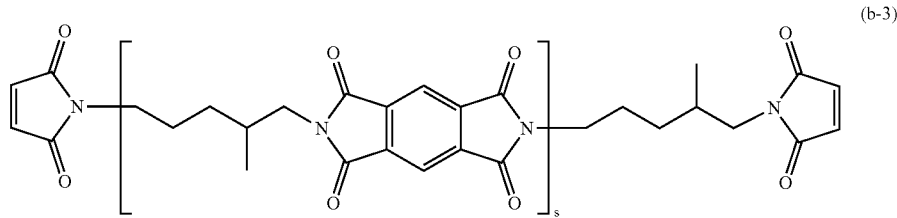
(b-3)

wherein s has an average value of about 1.

* * * * *